(12) United States Patent
Hsu et al.

(10) Patent No.: US 11,081,510 B2
(45) Date of Patent: Aug. 3, 2021

(54) PHOTOSENSITIVE MODULE HAVING TRANSPARENT PLATE AND IMAGE SENSOR

(71) Applicant: TDK TAIWAN CORP., Taoyuan (TW)

(72) Inventors: Chen-Er Hsu, Taoyuan (TW);
Sin-Jhong Song, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 173 days.

(21) Appl. No.: 16/354,491

(22) Filed: Mar. 15, 2019

(65) Prior Publication Data

US 2019/0288022 A1    Sep. 19, 2019

Related U.S. Application Data

(60) Provisional application No. 62/644,869, filed on Mar. 19, 2018.

(30) Foreign Application Priority Data

Jan. 21, 2019  (CN) .......................... 201910053477.9

(51) Int. Cl.
  *H01L 27/146* (2006.01)
  *G02B 7/02* (2021.01)
  (Continued)

(52) U.S. Cl.
  CPC ........ *H01L 27/14618* (2013.01); *G02B 7/021* (2013.01); *G02B 7/04* (2013.01); *H01L 27/14625* (2013.01); *H04N 5/2253* (2013.01); *H04N 5/2254* (2013.01); *H04N 5/2257* (2013.01); *G02B 5/208* (2013.01)

(58) Field of Classification Search
  CPC ... H04N 5/2254; H04N 5/2253; H04N 5/2257
  See application file for complete search history.

(56) References Cited

U.S. PATENT DOCUMENTS

2010/0110262 A1* 5/2010 Shirono ............... H04N 5/2171
  348/311
2012/0273908 A1* 11/2012 Kinsman ........... H01L 27/14634
  257/432

(Continued)

FOREIGN PATENT DOCUMENTS

CN    104282698 B    10/2017

*Primary Examiner* — Thanh Luu
(74) *Attorney, Agent, or Firm* — Muncy, Geissler, Olds & Lowe. P.C.

(57) ABSTRACT

A photosensitive module is provided, which can be disposed in an electronic device for receiving light passing through a lens in the electronic device, including a base assembly, an image sensor, a first plastic member and a transparent plate. The base assembly includes a substrate, and the substrate has a main body including a metal material. The image sensor is disposed on the base assembly and adjacent to the main body of the substrate. The first plastic member is connected to the base assembly and configured to protect the image sensor. The transparent plate is located on the first plastic member. When the photosensitive module receives the light passing through the lens, the light passes through the transparent plate to the image sensor.

18 Claims, 28 Drawing Sheets

(51) Int. Cl.
  *G02B 7/04*     (2021.01)
  *H04N 5/225*    (2006.01)
  *G02B 5/20*     (2006.01)

(56) References Cited

U.S. PATENT DOCUMENTS

| | | | |
|---|---|---|---|
| 2012/0276951 A1* | 11/2012 | Webster | H04N 5/2257 |
| | | | 455/556.1 |
| 2013/0010145 A1* | 1/2013 | Hagiwara | H01L 27/14627 |
| | | | 348/222.1 |
| 2015/0281532 A1* | 10/2015 | Yu | H04N 5/2254 |
| | | | 348/373 |
| 2015/0304528 A1* | 10/2015 | Shimizu | H04N 5/2171 |
| | | | 348/374 |
| 2018/0288296 A1* | 10/2018 | Wang | H01L 27/14618 |
| 2019/0086771 A1* | 3/2019 | Shen | H04N 5/2254 |

* cited by examiner

PHOTOSENSITIVE MODULE HAVING TRANSPARENT PLATE AND IMAGE SENSOR

CROSS REFERENCE TO RELATED APPLICATIONS

This application claims the benefit of U.S. Provisional Application No. 62/644,869, filed on Mar. 19, 2018, and China Patent Application No. 201910053477.9, filed on Jan. 21, 2019, the entirety of which is incorporated by reference herein.

BACKGROUND OF THE INVENTION

Field of the Invention

The application relates in general to a photosensitive module, and in particular to a photosensitive module having a transparent plate and an image sensor.

Description of the Related Art

Thanks to ongoing technological developments, the latest electronic devices (such as tablet computers and smartphones) usually include a lens module capable of aiding in photography or recording video, and some are even equipped with dual lens modules, bringing users a wealth of visual enjoyment. However, an image may come out blurry if the user shakes the electronic device when using it. To improve image quality, it is increasingly important to design an effectively shockproof lens module. Furthermore, designers are currently pursuing the miniaturization of such devices, and it is expected that electronic products will be smaller and lighter with each successive generation.

In addition, an image sensor in a lens module generates a large amount of heat when in operation, and the higher the pixel element, the higher the heat generated by the image sensor, so that the temperature of the entire lens module rises sharply. This may cause the module to fail to function properly or even to be damaged. Therefore, how to design a better product is an important issue.

BRIEF SUMMARY OF INVENTION

To address the deficiencies of conventional products, an embodiment of the invention provides a photosensitive module, which can be disposed in an electronic device for receiving light passing through a lens in the electronic device, including a base assembly, an image sensor, a first plastic member and a transparent plate. The base assembly includes a substrate, and the substrate has a main body including a metal material. The image sensor is disposed on the base assembly and adjacent to the main body of the substrate. The first plastic member is connected to the base assembly and configured to protect the image sensor. The transparent plate is located on the first plastic member. When the photosensitive module receives the light passing through the lens, the light passes through the transparent plate to the image sensor.

In some embodiments, the photosensitive module further comprises a thermal conductive adhesive disposed between the substrate and the image sensor. The base assembly further includes a first insulating layer, a circuit layer and a second insulating layer, wherein the first insulating layer is disposed between the substrate and the circuit layer, the circuit layer is disposed between the first insulating layer and the second insulating layer, the second insulating layer exposes at least one electrical connection point of the circuit layer, and the electrical connection point is electrically connected to the image sensor. The first insulating layer and the second insulating layer each have an opening, and the thermal conductive adhesive is disposed in the openings and is in contact with the image sensor through the openings.

In some embodiments, the first plastic member has at least one through hole, and the first plastic member has a rectangular structure, and the through hole is located in a side wall of the rectangular structure and penetrates the side wall. The through hole has an outer opening and an inner opening, the outer opening is further from the image sensor than the inner opening, and the outer opening is closer to the reference surface of the substrate than the inner opening. The photosensitive module further comprises a second plastic member, wherein the transparent plate is located between the first plastic member and the second plastic member, and the transparent plate is sandwiched between the first plastic member and the second plastic member.

In some embodiments, the photosensitive module further comprises a lead assembly connecting the image sensor to the base assembly. The lead assembly is encapsulated by the first plastic member. The first plastic member forms a receiving space with the base assembly, and the image sensor and the lead assembly are located in the receiving space. the photosensitive module further comprises a second plastic member connected to and disposed outside the first plastic member, and the second plastic member sustains the transparent plate, wherein the lead assembly is disposed outside the first plastic member and covered by the second plastic member and not in contact with the first plastic member. In some embodiments, the photosensitive module further comprises a second plastic member connected to and disposed inside the first plastic member, and the second plastic member sustains the transparent plate, wherein the lead assembly is covered by the second plastic member and is not in contact with the first plastic member.

In some embodiments, the photosensitive module further comprises a soldering assembly connecting the image sensor to the base assembly, and the soldering assembly overlaps the photosensitive component when viewed from the light-incident direction. The photosensitive module further comprises a second plastic member disposed on the first plastic member, wherein the transparent plate is located between the first plastic member and the second plastic member, and the transparent plate is disposed on the second plastic member and not in contact with the first plastic member. The substrate further includes a circuit sub-substrate, wherein the circuit sub-substrate has a through slot, and the main body of the substrate is disposed in the through slot. Both the main body and the circuit sub-substrate have a metal material, and the main body and the circuit sub-substrate have different metal materials.

In some embodiments, the substrate further comprises a circuit sub-substrate, wherein the circuit sub-substrate has a through slot, and the image sensor is disposed in the through slot and is surrounded by the circuit sub-substrate, and the through slot is covered by the main body of the substrate. In some embodiments, the substrate further comprises a vibration assembly disposed on the first plastic member and configured to drive the transparent plate, wherein at least a portion of the vibration assembly overlaps the image sensor when viewed from the light-incident direction.

In some embodiments, the vibration assembly includes at least two vibration members: a first vibration member and a second vibration member, and both are disposed on the first plastic member and configured to drive the transparent plate; wherein the first vibrating member drives the transparent plate to move in a first direction, and the second vibrating member drives the transparent plate to move in a second direction, and the first direction is different from the second direction.

In some embodiments, the photosensitive module further comprises a plurality of transparent plates arranged along the light-incident direction, and the vibration assembly drives the transparent plate which is farther from the image sensor. The photosensitive module further comprises a catching member disposed on an outer side of the first plastic member and adjacent to the transparent plate, for capturing the dust that falls from the transparent plate because of the vibration produced by the vibration assembly.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the optical systems are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
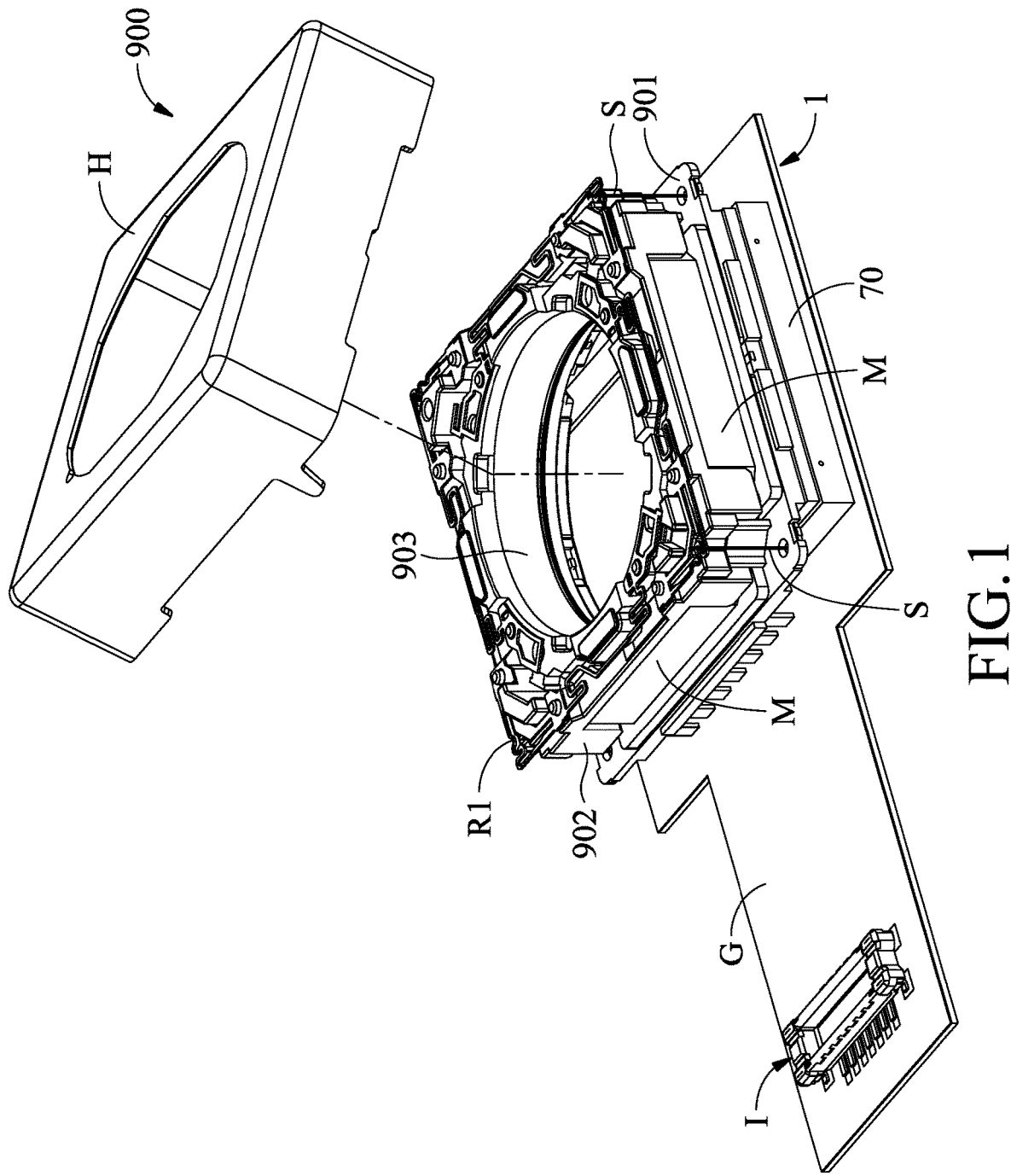
FIG. 1 is a schematic diagram of a photosensitive module and an optical driving mechanism according an embodiment of the present invention.

FIG. 1 is a schematic diagram showing a photosensitive module 1 with an optical driving mechanism 900 according to an embodiment of the present invention. The photosensitive module 1 is disposed under the optical driving mechanism 900, and the optical driving mechanism 900 can be used to drive and sustain an optical element (such as a lens), and the optical driving mechanism 900 and the optical element can be disposed inside an electronic device (such as a camera, a tablet or a mobile phone). When light (incident light) from the outside enters the optical driving mechanism 900, the incident light passes through the optical element in the light-incident direction O (or optical axis), and reaches an image sensor on the photosensitive module 1, to acquire an image. The structure of the optical driving mechanism 900 associated with the photosensitive module 1 will be described below.

Figure 2:
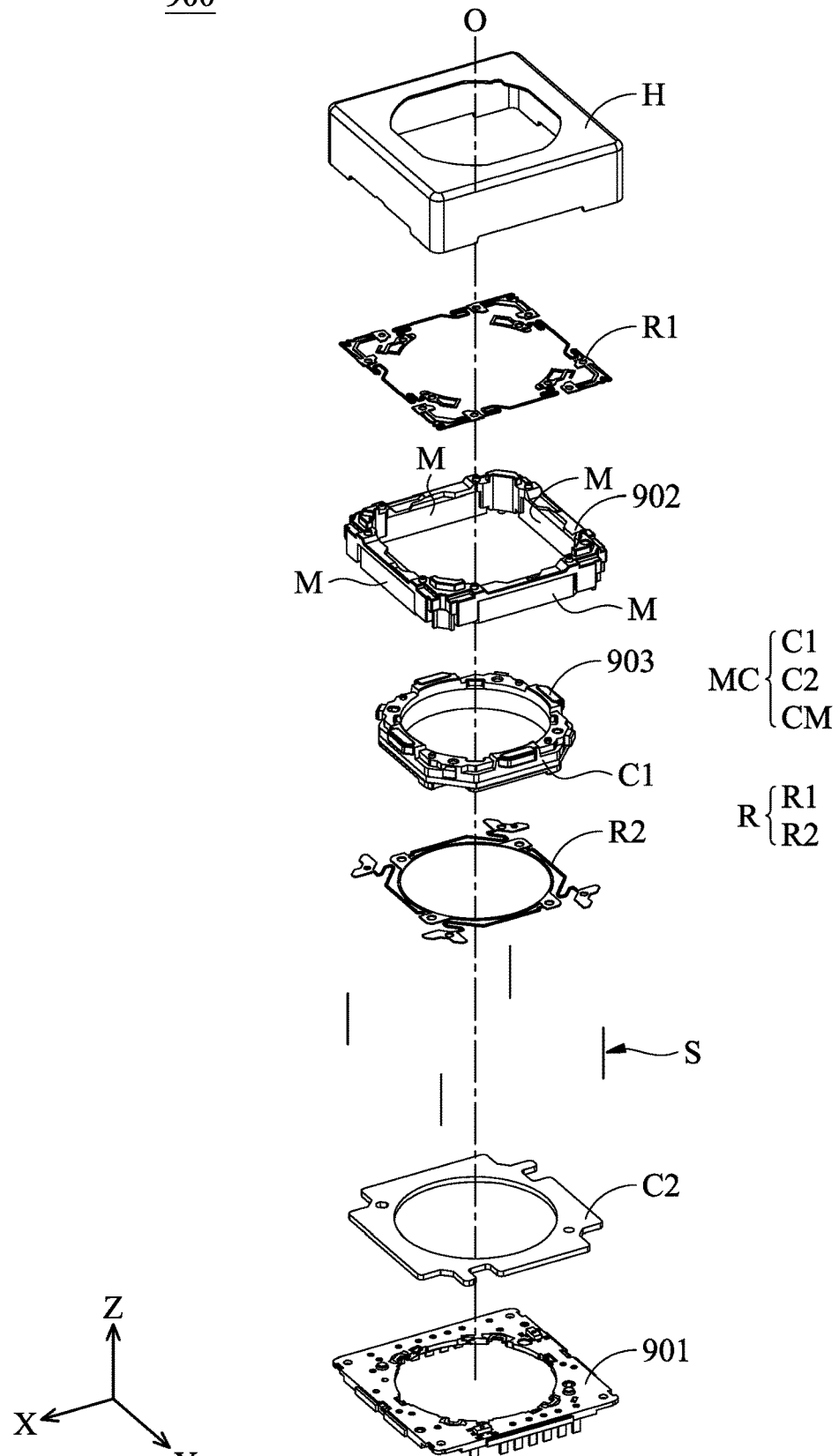
FIG. 2 is an exploded view diagram of the optical driving mechanism in FIG. 1.

Refer to FIG. 2, which shows that the optical driving mechanism 900 includes a base 901, a frame 902, a holder 903, an electromagnetic driving assembly MC, a leaf spring assembly R, an elastic assembly S and a housing H. The housing H is disposed on the base 901 to form an accommodating space for accommodating the frame 902, the holder 903, the electromagnetic driving assembly MC, the leaf spring assembly R and the elastic assembly S. The holder 903 can be used to carry an optical element (for example, a lens). The frame 902 is disposed outside the holder 903. The electromagnetic driving assembly MC includes a plurality of magnetic elements M (for example, magnets), a coil C1 and a plate coil C2, wherein the coil C1 is disposed around the holder 903, and the magnetic elements M are disposed on the frame 902 and around the holder 30 to face the coil C1, and the flat coil C2 is disposed on the base 901. The leaf spring assembly R includes an upper leaf spring R1 and a lower leaf spring R2 that are movably connected to the holder 903 and the frame 902, so that the holder 903 is movable relative to the frame 902.

When a driving signal (for example, a driving current) is applied to the coil C1 by an external power source (not shown), a magnetic force can be generated between the magnetic elements and the coil to drive the holder 903 to move relative to the frame 902, for optical focusing or shake compensation. In addition, the upper and lower leaf springs R1 and R2 keep the holder 903 in an initial position relative to the frame 902 before the driving signal is applied. The electromagnetic driving assembly MC in this embodiment is a moving coil type. In other embodiments, it may be a moving magnetic type.

The elastic assembly S has four elongated elastic elements disposed at four corners of the base 901 and connects the base 901 and the frame 902, so that the frame 902 is movable relative to the base 901. The flat coil C2 can be arranged to correspond to the magnetic elements M. As the magnetic force generated between the magnetic elements M and the coil C1 to move the holder 903 by applying a driving signal to the coil C1, a driving signal also can be applied to the flat coil C2, and a magnetic force generated between the magnetic elements M and the flat coil C2, to drive the holder 903 (with the optical element disposed therein) and the frame 902 to move (for example, moving on the XY plane), to achieve the offset compensation and shockproof effect. In other embodiments, the elastic assembly S can also include one elastic element with a suitable guiding mechanism (such as a slide rail) or other number (for example, two or three) of elastic elements.

The base 901 may be provided with a magnetic field sensing element for sensing a change in the magnetic field of the magnetic element M. Specifically, the magnetic field sensing element can be a Hall Effect Sensor, the magnetic element M can be a permanent magnet, and the Hall effect Sensor can detect the magnetic field change of the permanent magnet, to determine the position of the permanent magnet, thereby detecting the positional deviation of the holder 903 and the optical element disposed therein relative to the base 901 due to vibration. In some embodiments, the magnetic field sensing element can also use other types of sensing components, such as a magnetoresistive sensor (MRS) or an optical sensor, to sense the relative positions of the holder 903, the frame 902 and the base 901.

The present invention provides a photosensitive module of several embodiments, such as the following photosensitive modules 1 to 8, 100, 200, 300, which can be individually combined with the optical driving mechanism 900 to form a camera module. The detailed structure of the above-described photosensitive modules 1 to 8, 100, 200, and 300 will be described below.

Embodiment 1

Figure 3:
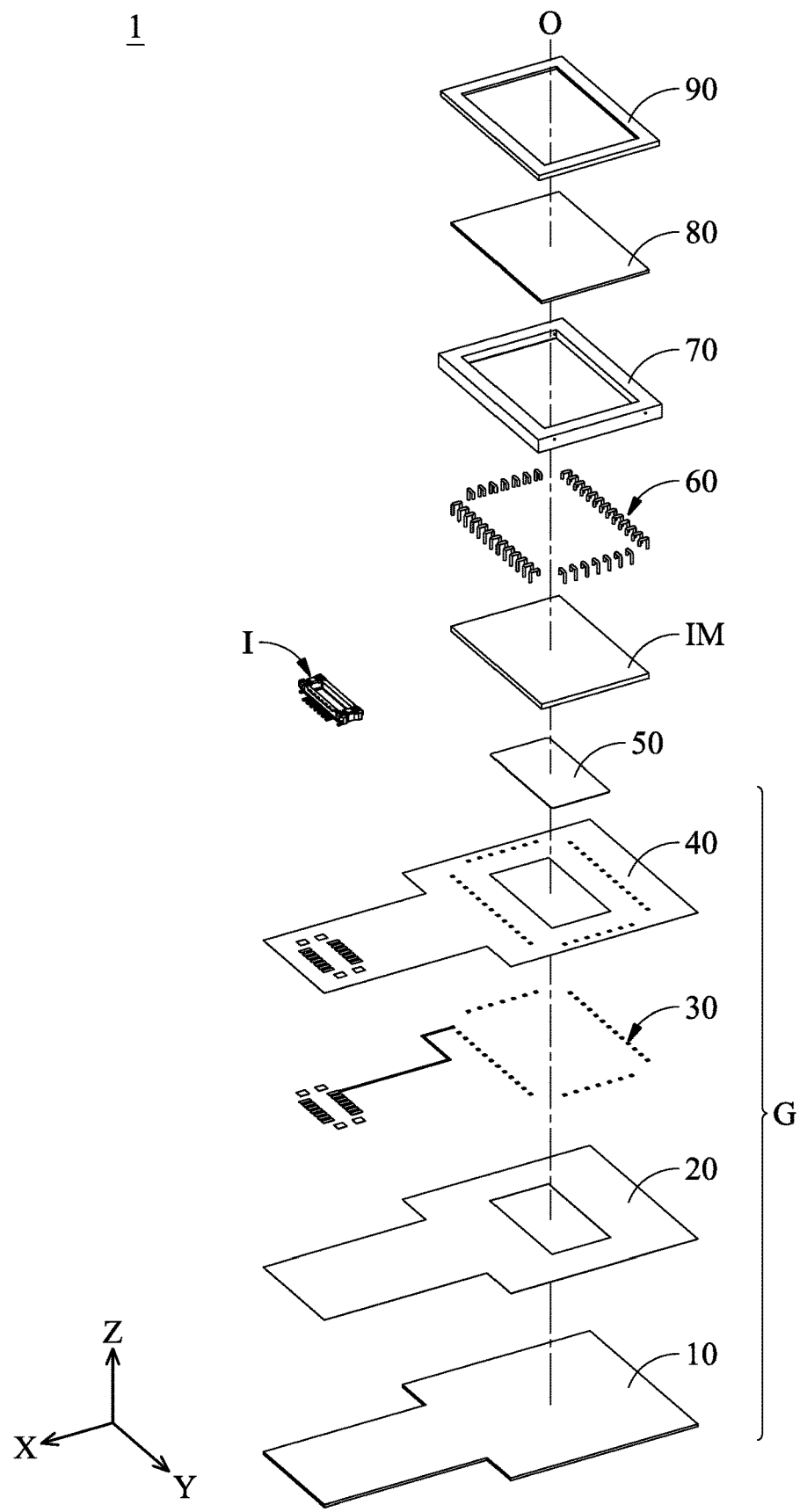
FIG. 3 is an exploded view diagram of the photosensitive module in FIG. 1.

Refer to FIG. 3, which shows that the photosensitive module 1 can be used to receive light passing through an optical component (such as a lens) of the optical driving mechanism 900, and includes a base assembly G (including a substrate 10 and a first insulating layer 20, a circuit layer 30 and a second insulating layer 40), a thermal conductive adhesive 50, an image sensor IM, a lead assembly 60, a first plastic member 70, a transparent plate 80 and a second plastic member 90. The main body 101 of the substrate 10 includes or is made of a metal material. The first insulating layer 20 is disposed between the substrate 10 and the circuit layer 30, and the circuit layer 30 is disposed between the first insulating layer 20 and the second insulating layer 40. The first insulating layer 20 can be used to block the circuit layer 30 from being electrically connected to the substrate 10 below (Z-axis) to avoid short circuit, and the second insulating layer 40 can be used to prevent the circuit in other mechanisms from being located above (Z-axis) from being electrically connected to the circuit layer 30 to cause a short circuit problem.

The thermal conductive adhesive 50 is provided on the substrate 10. The thermal conductive adhesive 50 may be, for example, a thermal conductive resin. In detail, the thermal conductive adhesive 50 is disposed in the openings 201 and 401 of the first and the second insulating layers 20 and 40, and passes through the openings 201 and 401 to be in contact with the image sensor IM, and the lower portion of the thermal conductive adhesive 50 is in contact with the main body 101 of the substrate 10. In this way, the heat of the image sensor IM can dissipated via the thermal conductive adhesive 50 and the substrate 10, thereby further improving the heat dissipation efficiency of the photosensitive module 1.

The lead assembly 60 has a plurality of leads disposed around the image sensor IM, and is electrically connected to the image sensor IM and the plurality of electrical connection points of the circuit layer 30 exposed by the second insulating layer 40, and the first plastic member 70 is encapsulated around the lead assembly 60 for protection. The second plastic member 90 is used for fixing the transparent plate 80 to the first plastic member 70 and protecting the transparent plate 80. The transparent plate 80 can be an infrared filter or a low-pass filter which is able to block heat or infrared light. Both the first and the second plastic members 70 and 90 have a hollow structure. When light from the outside passes through the lens in the optical driving mechanism 900 to the photosensitive module 1, the light passes through the transparent plate 80 and the image sensor of the photosensitive module 1 in sequence. In addition, a connecting member I is disposed on the base assembly G and electrically connects the exposed electrical connection points of the circuit layer 30, which can be used as an element for connecting the outside of the photosensitive module 1.

In this embodiment of the present invention, the heat dissipation efficiency can be greatly improved by providing the thermal conductive adhesive 50 to be in contact with the image sensor IM, so that the overall camera system can be more stable, and the electrical connection structures and the transparent plate 80 are more stable and better protected via the first and the second plastic members 70 and 90, which can improve the reliability of the module. Furthermore, using the substrate 10 which has a metal material as a base, since it has good flatness, in addition to reducing the degree of skew of the image sensor IM relative to the substrate 10, it is also advantageous to provide other electronic components (for example, the connecting member I) disposing on the substrate 10, thereby simplifying the overall wiring to achieve miniaturization.

Figure 4A:
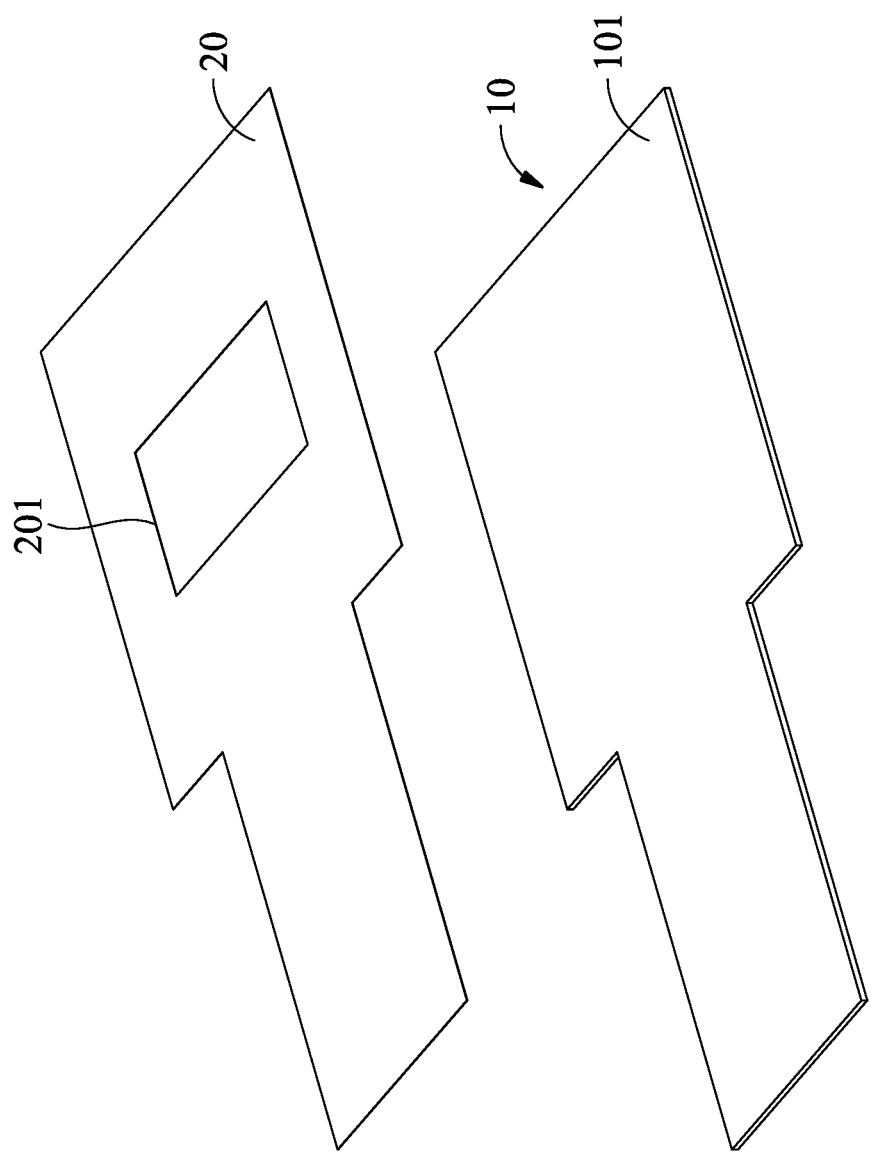
FIGS. 4A to 4G are schematic diagrams showing the process flow chart of the photosensitive module.
Figure 4B:
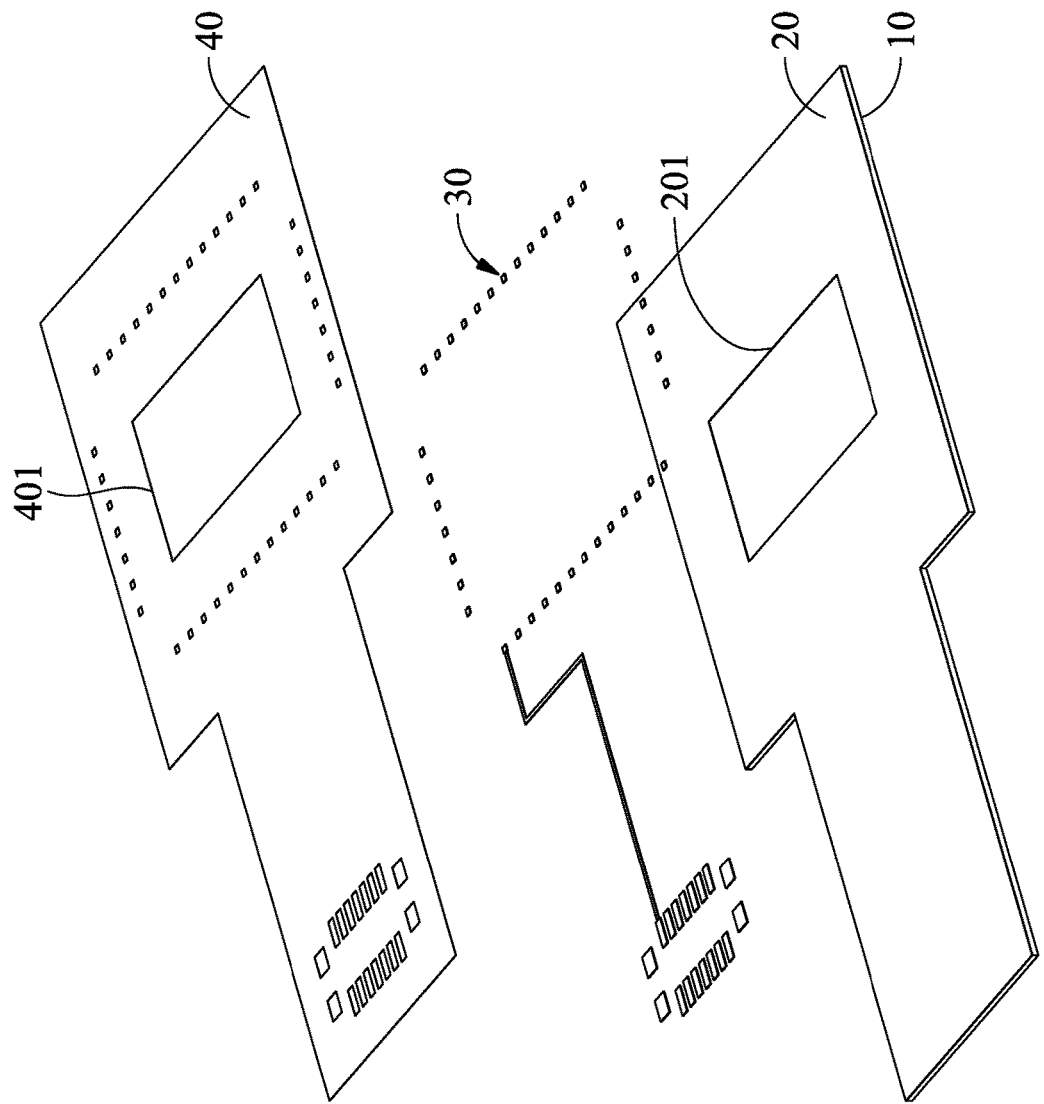
Figure 4C:
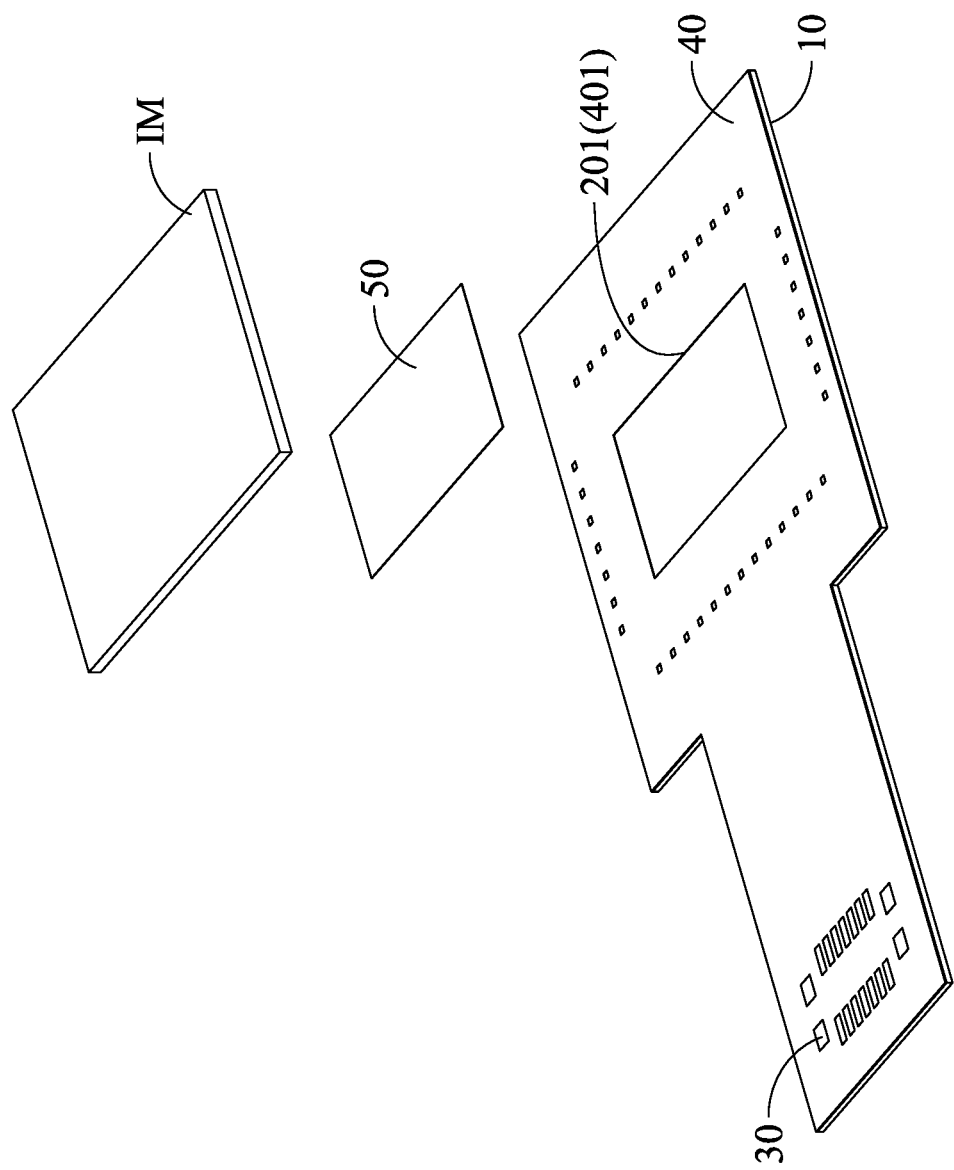

FIGS. 4A to 4G show the process flow chart of the photosensitive module 1. As shown in FIG. 4A, a substrate 10 is provided, the main body 101 thereof has or is made of a metal material and covers a first circuit layer 20. The first circuit layer 20 has an opening 201 to expose a portion of the main body 101 of the substrate 10. Refer to FIG. 4B, in which a circuit layer 30 covers the first circuit layer 20, and a second insulating layer 40 covers the circuit layer 30. The second insulating layer 40 also has an opening 401 corresponding to the opening 201 of the first circuit layer 20, wherein a portion of the main body 101 of the substrate 10 is exposed, and the second insulating layer 40 also exposes a plurality of electrical connection points of the circuit layer 30. Refer to FIG. 4C, in which a thermal conductive adhesive 50 is disposed on the substrate 10, wherein the thermal conductive adhesive 50 is in contact with the substrate 10 through the openings 201 and 204 of the first and second insulating layers 20 and 40; and an optical component IM that is in contact with the thermal conductive adhesive 50 is provided.

Figure 4D:
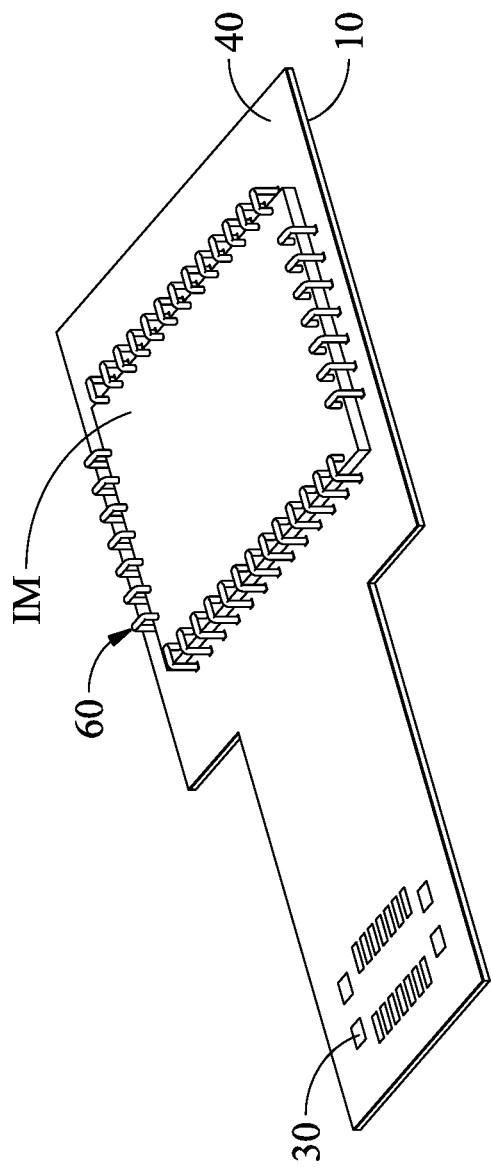
Figure 4E:
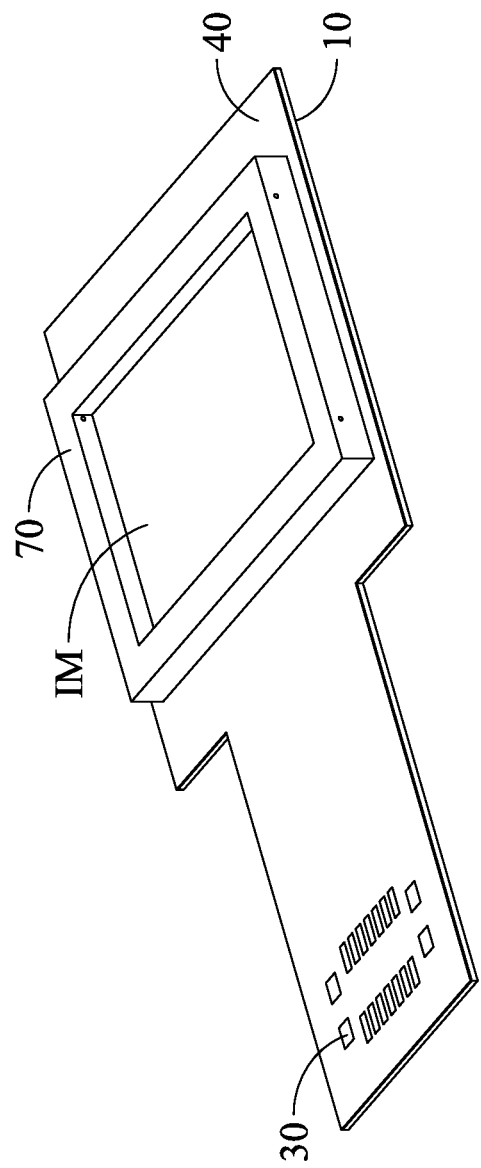
Figure 4F:
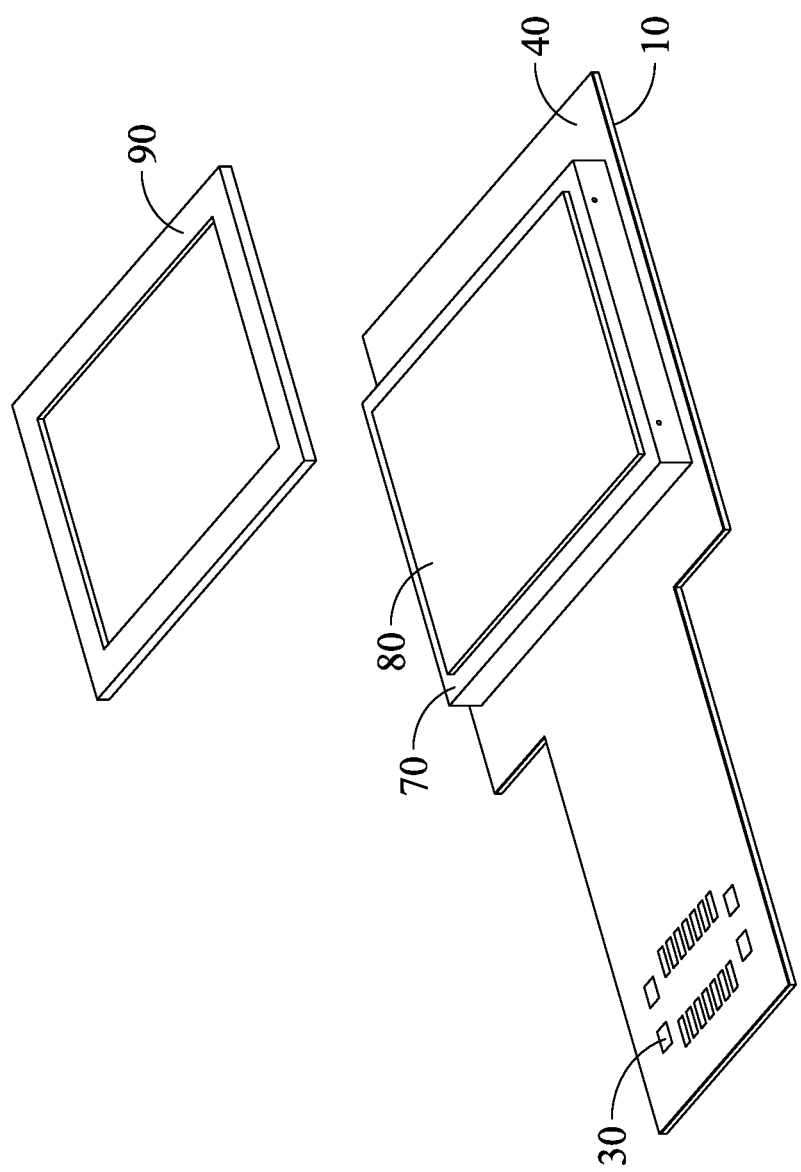
Figure 4G:
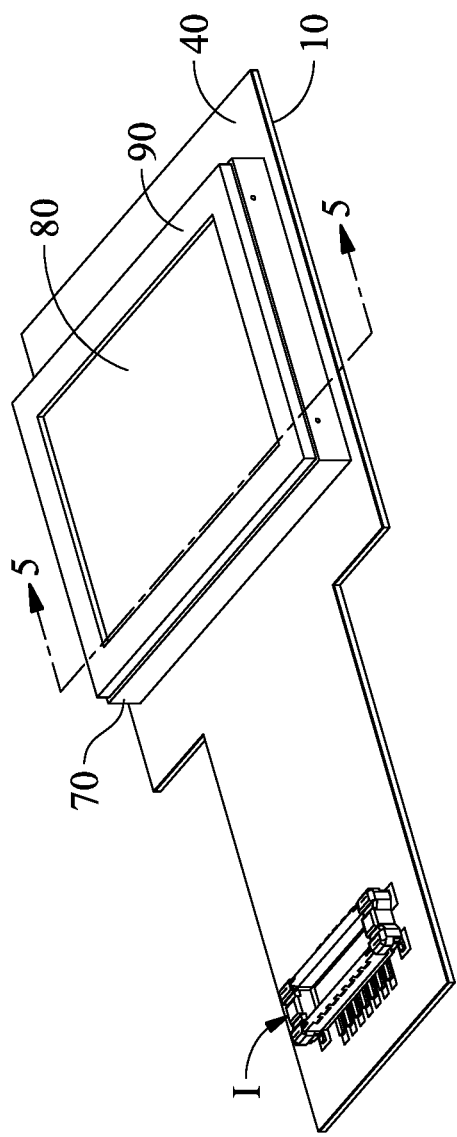

Refer to FIG. 4D, in which a lead assembly 60 is provided to electrically connect the plurality of electrical connection points of the image sensor IM to the circuit layer 30. Refer to FIG. 4E, in which a first plastic member 70 is disposed on the periphery of the lead assembly 60 and covers it for protection. Refer to FIG. 4F, in which a transparent plate 80 is disposed on the first plastic member 70, and a second plastic member 90 is disposed on the first plastic member 70 and the transparent plate 80, to surround the transparent plate 80, so that the transparent plate 80 is clamped between the first and second plastic members 70 and 90 to be affixed. The height of the transparent plate 80 is lower than the height of the second plastic member 90 (Z-axis direction), thereby the impact of other components or parts on the transparent plate 80 can be avoided or reduced. Refer to FIG. 4G, in which a connecting member I is disposed on the substrate 10 and connected to the electrical connection points of the circuit layer 30, for connecting external components and parts.

Figure 5:
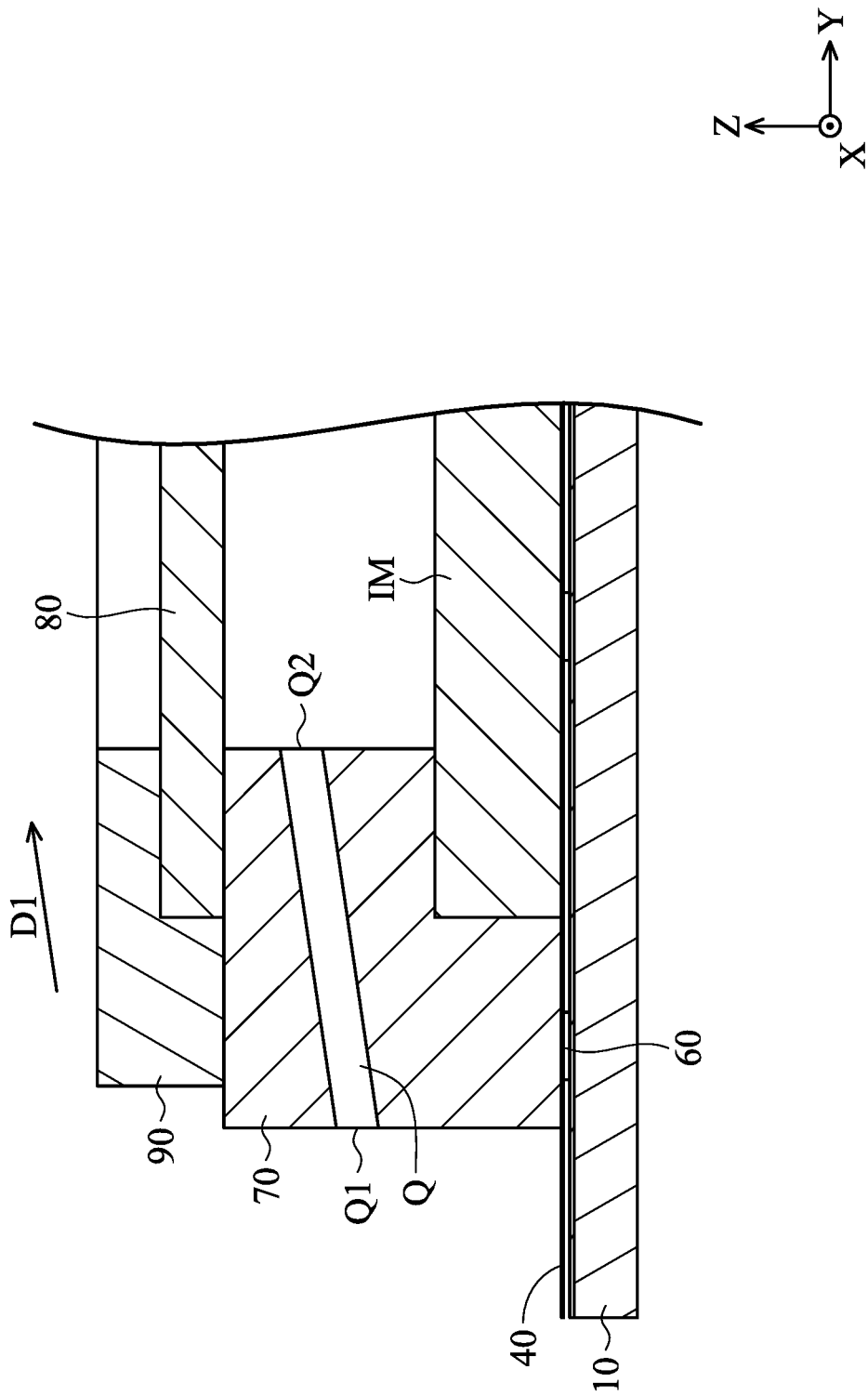
FIG. 5 is a partial cross-sectional view taken along line 5-5 of FIG. 4G.

It should be noted that, as shown in FIG. 4G and FIG. 5 (which is a cross-sectional views taken along line 5-5 of FIG. 4G), the first plastic member 70 has a plurality of through holes Q substantially at the four corners of the rectangular structure of the first plastic member 70. Or, the through holes Q are respectively located on the side walls of the rectangular structure and penetrating the side walls. The space between the image sensor IM and the transparent plate 80 can be connected to the outside through the through holes Q. This configuration avoids situations in which the air in the enclosed space inside the photosensitive module 1 expands and thereby causes the photosensitive module 1 to become deformed or destroyed by the high heat and high pressure generated by other processing procedures. Moreover, each through hole Q has an outer opening Q1 and an inner opening Q2, wherein the outer opening Q1 is further from the image sensor IM than the inner opening Q2, and the position of the outer opening Q1 is lower than the position of the inner opening Q2 in Z-axis direction. That is, the outer opening Q1 is closer to the reference surface of the substrate 10 than the inner opening Q2. The direction of the through hole Q is shown by direction D1 in FIG. 5. The through hole Q has a slope which is inclined upward toward the inside of the photosensitive module 1 or the image sensor IM. Therefore, the chance of foreign matter entering the photosensitive module 1 can be avoided or greatly reduced during the manufacturing process.

Embodiment 2

Figure 6A:
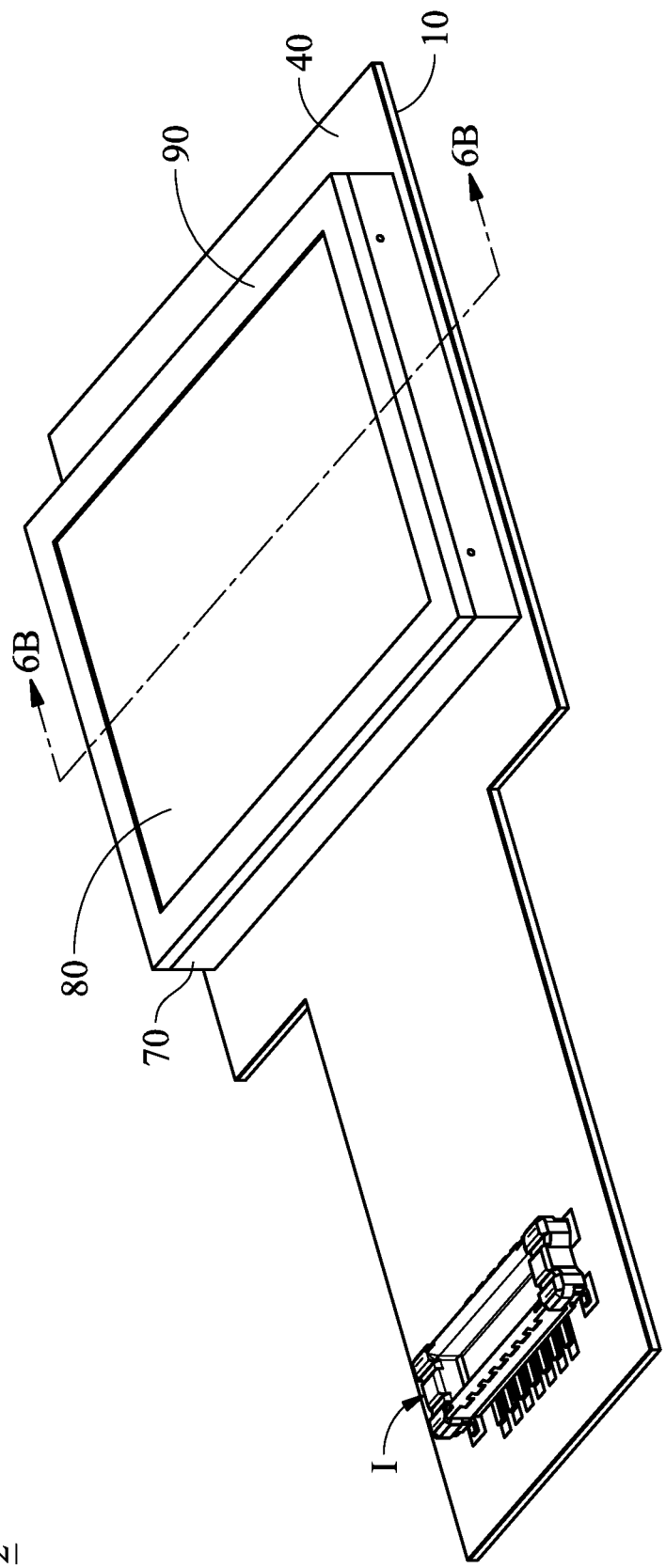
FIG. 6A is a schematic diagram of a photosensitive module according to another embodiment of the present invention.
Figure 6B:
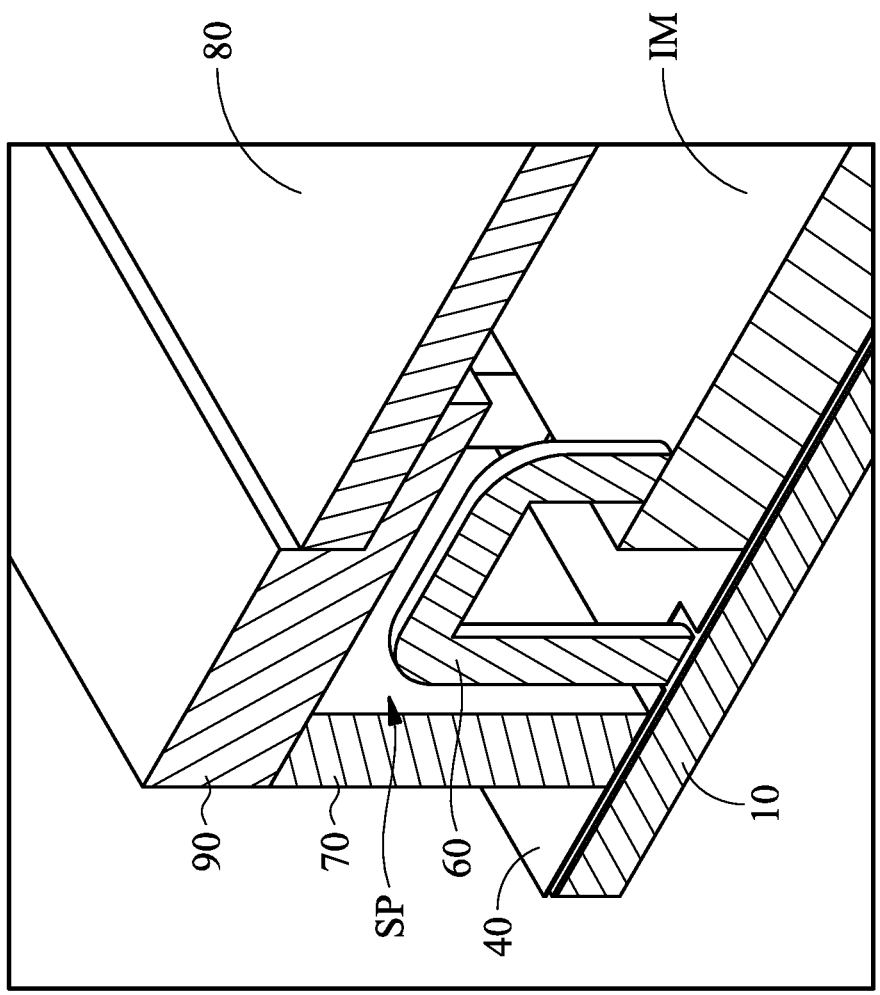
FIG. 6B is a partial cross-sectional view taken along line 6B-6B of FIG. 6A.

Refer to FIGS. 6A-6B, which shows a photosensitive module 2 according to another embodiment of the present invention. The main difference between the photosensitive module 2 of the present embodiment and the photosensitive module 1 is that the first plastic member 70 is disposed on the periphery of the lead assembly 60 but is not in contact therewith. A receiving space SP is formed between the first plastic member 70 and the substrate 10 (or the substrate assembly G), and the image sensor IM and the lead assembly 60 are located in the receiving space SP. The second plastic member 90 is disposed on the first plastic member 70 and carries the transparent plate 80, and the height of the transparent plate 80 is also lower than the second plastic member 90 (Z-axis direction), so that the probability of the transparent plate 80 being impacted is reduced.

Embodiment 3

Figure 7A:
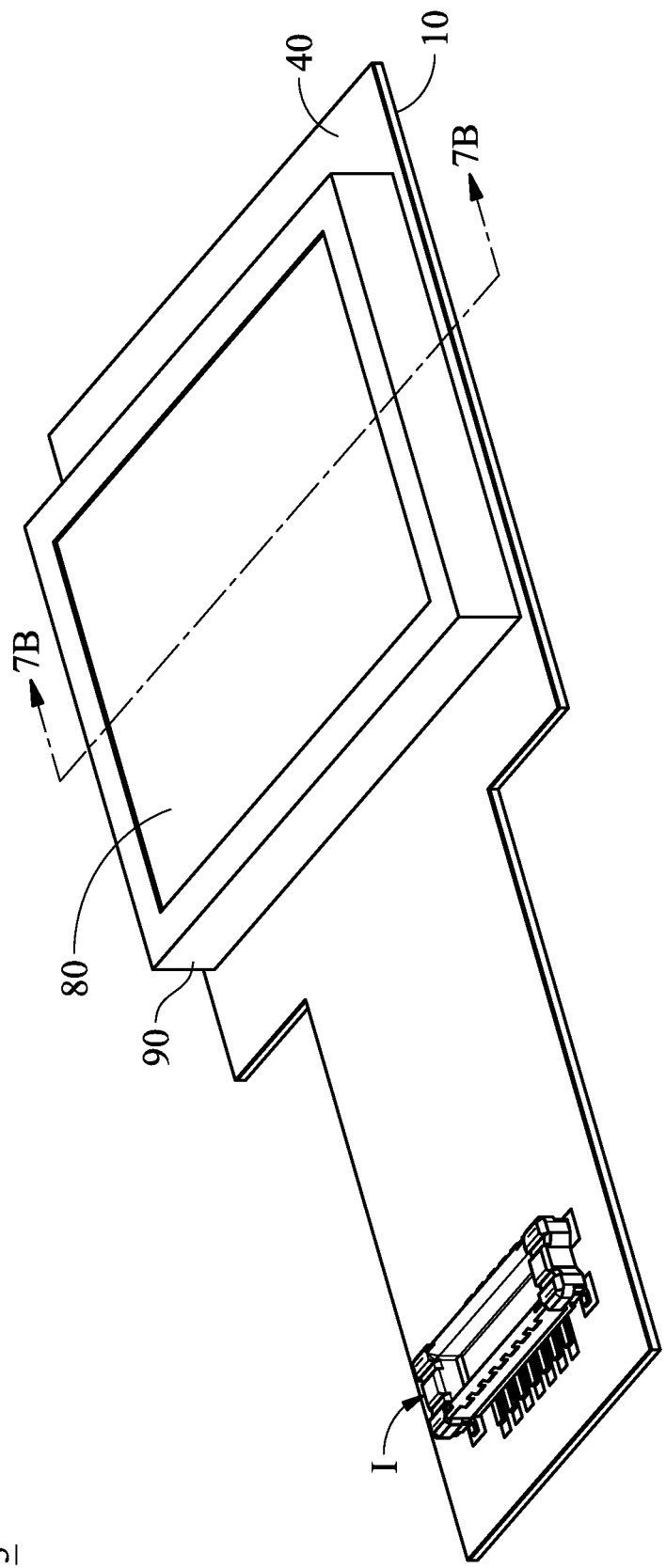
FIG. 7A is a schematic diagram of a photosensitive module according to another embodiment of the present invention.
Figure 7B:
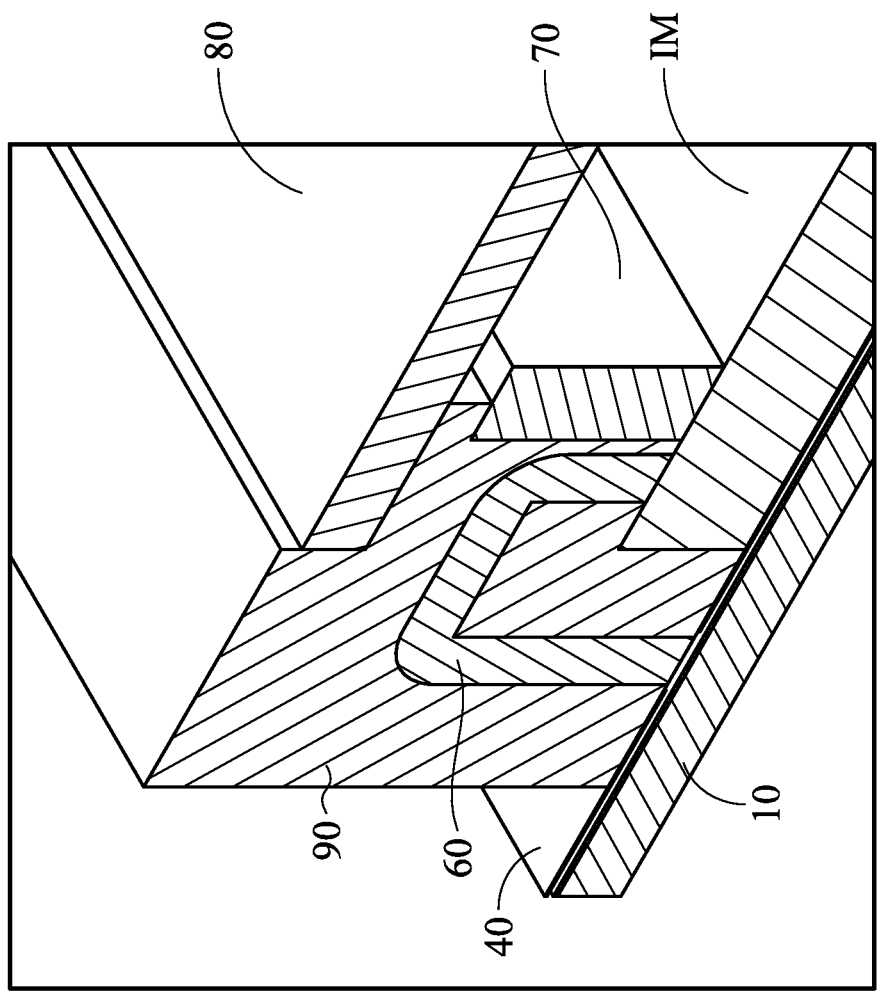
FIG. 7B is a partial cross-sectional view taken along line 7B-7B of FIG. 7A.

Refer to FIGS. 7A-7B, which shows a photosensitive module 3 according to another embodiment of the present invention. The main difference between the photosensitive module 3 of the present embodiment and the photosensitive module 1 (embodiment 1) is that the first plastic member 70 is disposed on the inner side of the lead assembly 60 and is not in contact therewith, and the second plastic member 90 is disposed on the periphery of the first plastic member 70, wherein the transparent plate 80 is connected to and carried by the second plastic member 90. Since the first plastic member 70 is disposed inside the opening of the second plastic member 90, so that it has the better function of supporting the second plastic member 90, thereby the overall mechanical strength can be increased. The height of the transparent plate 80 is lower than that of the second plastic member 90 (Z-axis direction), reducing the probability that the transparent plate 80 is subjected to impact.

Embodiment 4

Figure 8A:
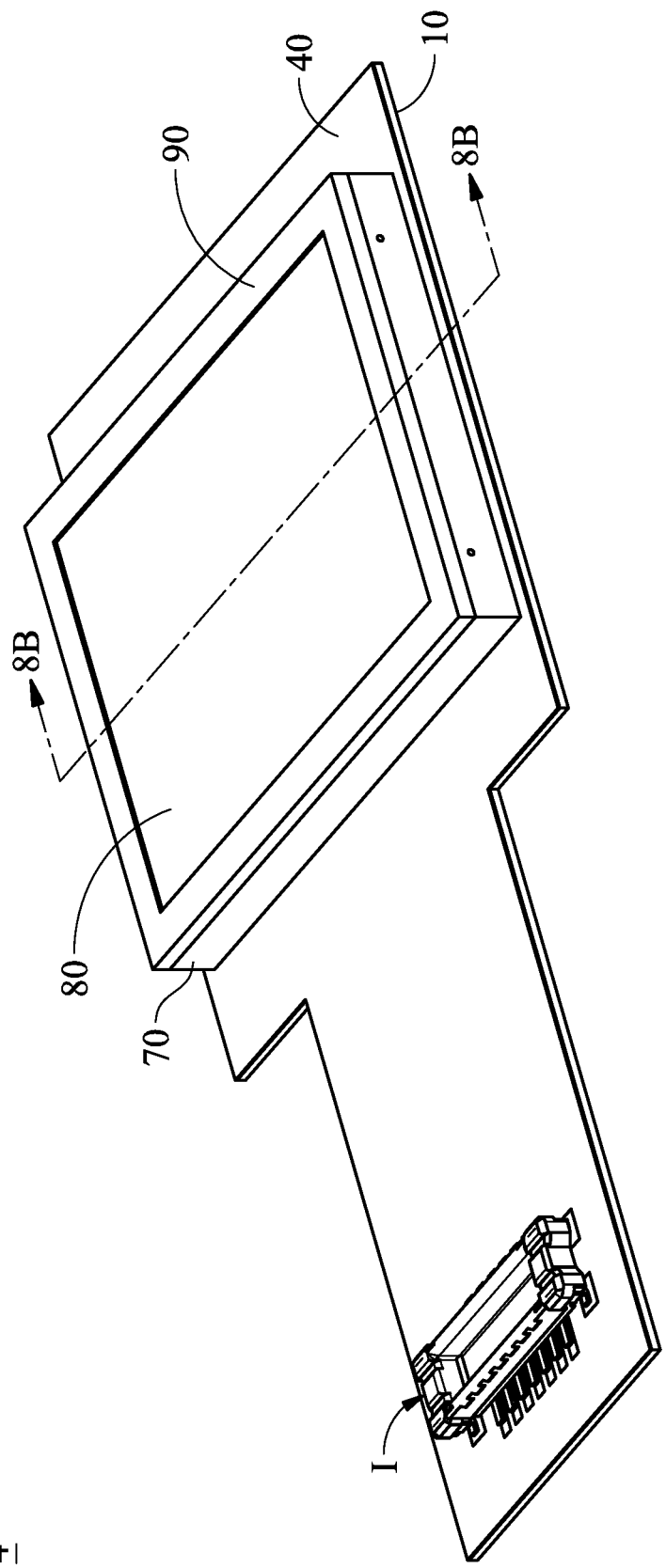
FIG. 8A is a schematic diagram of a photosensitive module according to another embodiment of the present invention.
Figure 8B:
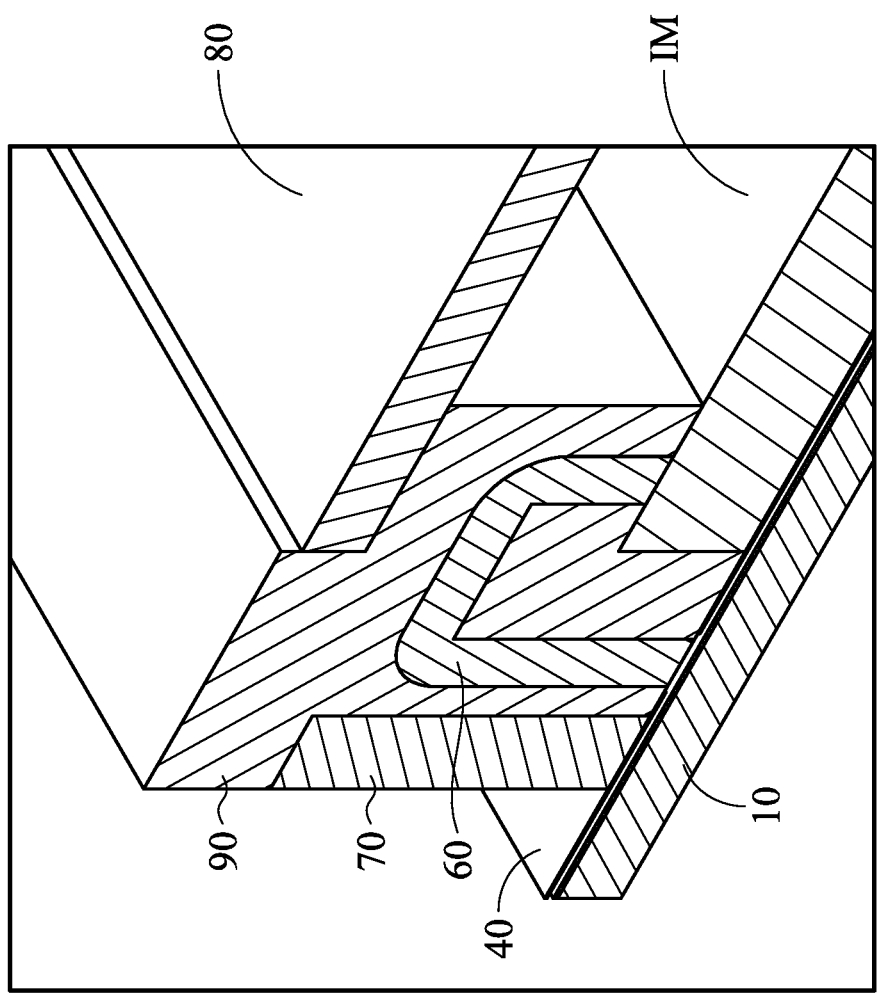
FIG. 8B is a partial cross-sectional view taken along line 8B-8B of FIG. 8A.

Refer to FIGS. 8A-8B, which shows a photosensitive module 4 according to another embodiment of the present invention. The main difference between the photosensitive module 4 of the present embodiment and the photosensitive module 1 is that the first plastic member 70 is disposed outside the lead assembly 60 and is not in contact therewith, and the second plastic member 90 is disposed on the inner side of the first plastic member 70. The transparent plate 80 is carried and the lead assembly 60 is covered by the second plastic member 90. The second plastic member 90 is supported by the first plastic member 70 to enhance the overall mechanical strength. Further, the height of the transparent plate 80 is also lower than that of the second plastic member 90 (Z-axis direction), so that the probability of the transparent plate 80 being impacted can be decreased.

Embodiment 5

Figure 9:
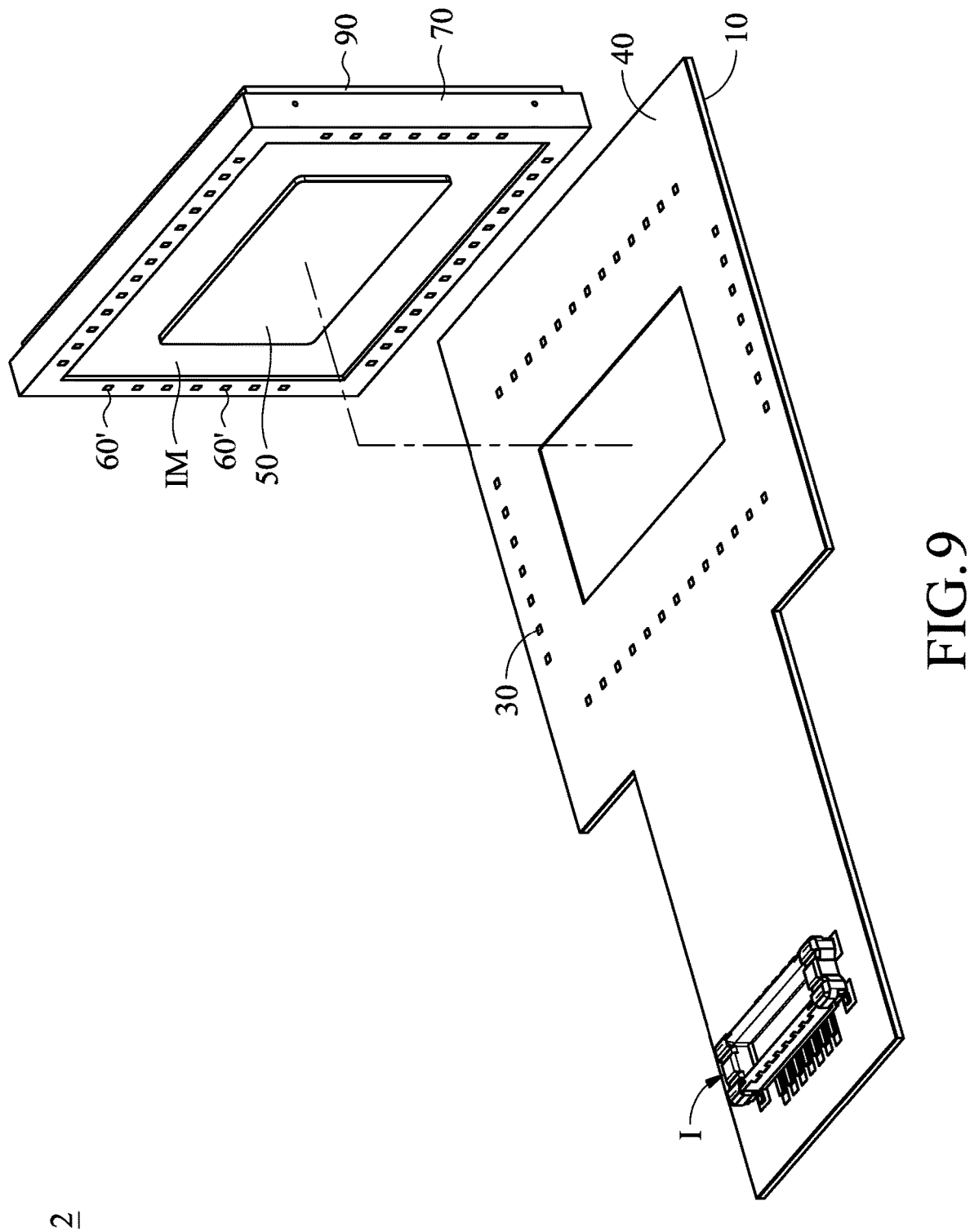
FIG. 9 is a schematic diagram of a photosensitive module according to another embodiment of the present invention.

Refer to FIG. 9, which is a photosensitive module 5 according to another embodiment of the present invention. The main difference between the photosensitive module 5 of the present embodiment and the photosensitive module 1 is that the photosensitive module 5 does not have the lead assembly 60, but includes a soldering assembly 60' having a plurality of soldering points, and the image sensor IM is connected to the circuit layer 30 by the soldering assembly 60'. When viewed from the light-incident direction O, the soldering assembly 60' overlaps the image sensor IM, and the soldering member 60' and the image sensor IM are covered by the first plastic member 70 to enhance the mechanical structure. Since the photosensitive module 5 of the embodiment does not have any lead wires, the thickness of the entire module can be reduced further to achieve miniaturization.

Embodiment 6

Figure 10A:
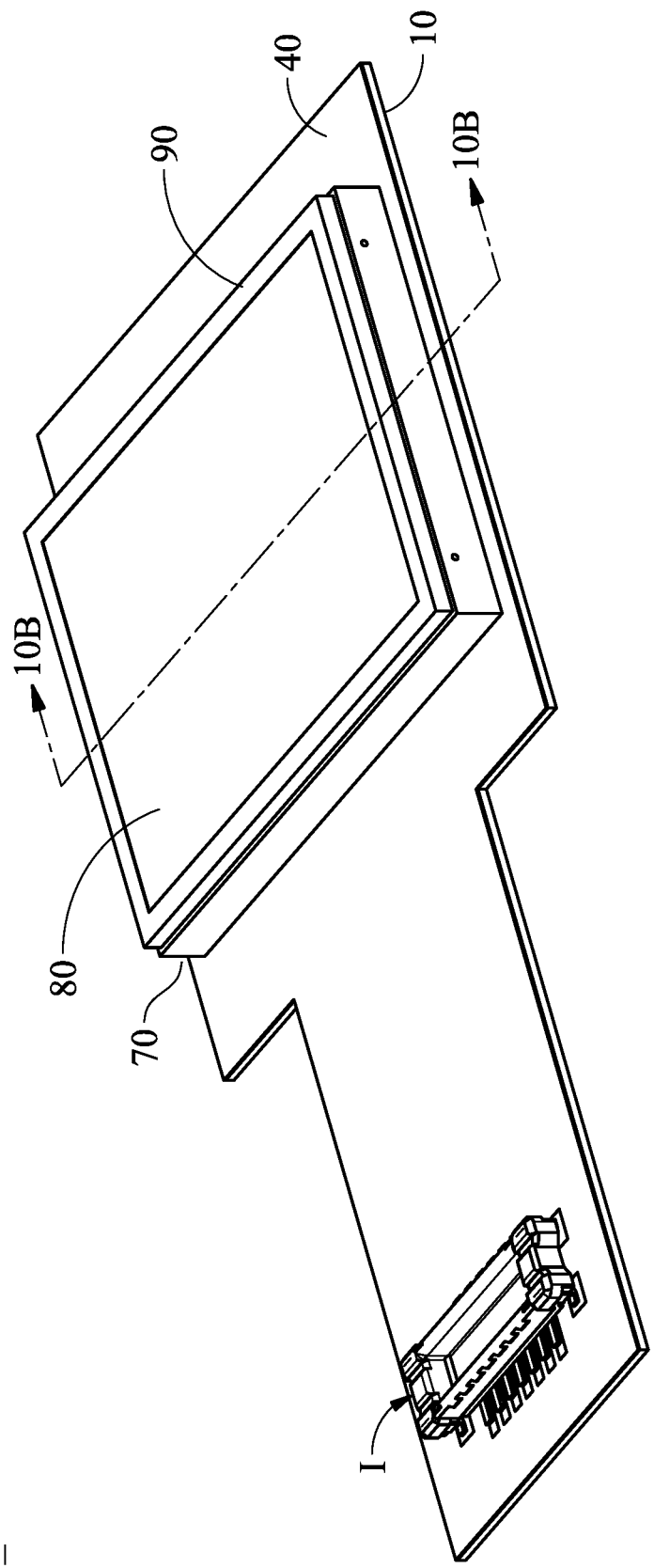
FIG. 10A is a schematic diagram of a photosensitive module according to another embodiment of the present invention.
Figure 10B:
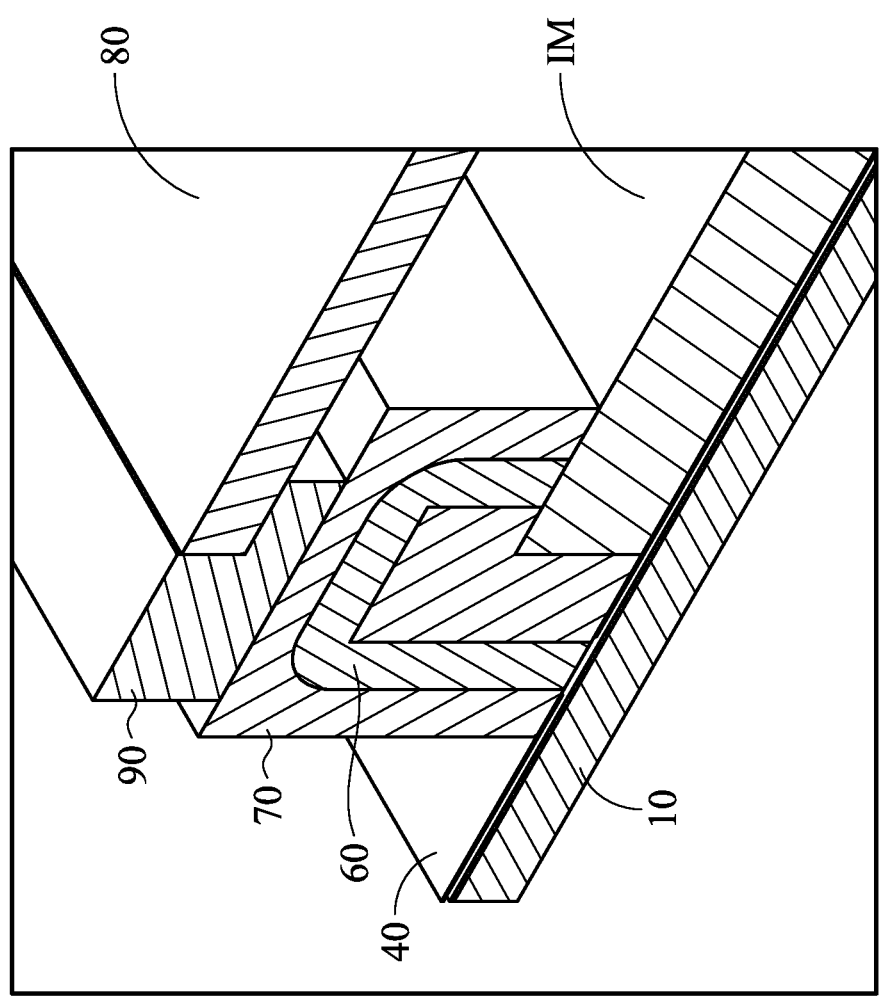
FIG. 10B is a partial cross-sectional view taken along line 10B-10B of FIG. 10A.

Refer to FIGS. 10A-10B, which shows a photosensitive module 6 according to another embodiment of the present invention. The main difference between the photosensitive module 6 of the present embodiment and the photosensitive module 1 is that the transparent plate 80 is placed on the second plastic member 90 and is not directly in contact with the first plastic member 70, which is different from the transparent plate 80 clapped between the first and second plastic members 70 and 90 in the embodiment 1. The transparent plate 80 of the present embodiment can be placed on the second plastic member 90 after the second plastic member 90 is disposed on the first plastic member 70. This simplifies the manufacturing process, and the assembly tolerance can be reduced since the transparent plate 80 is in contact with the second plastic member 90 and not with the first plastic member 70.

Embodiment 7

Figure 11:
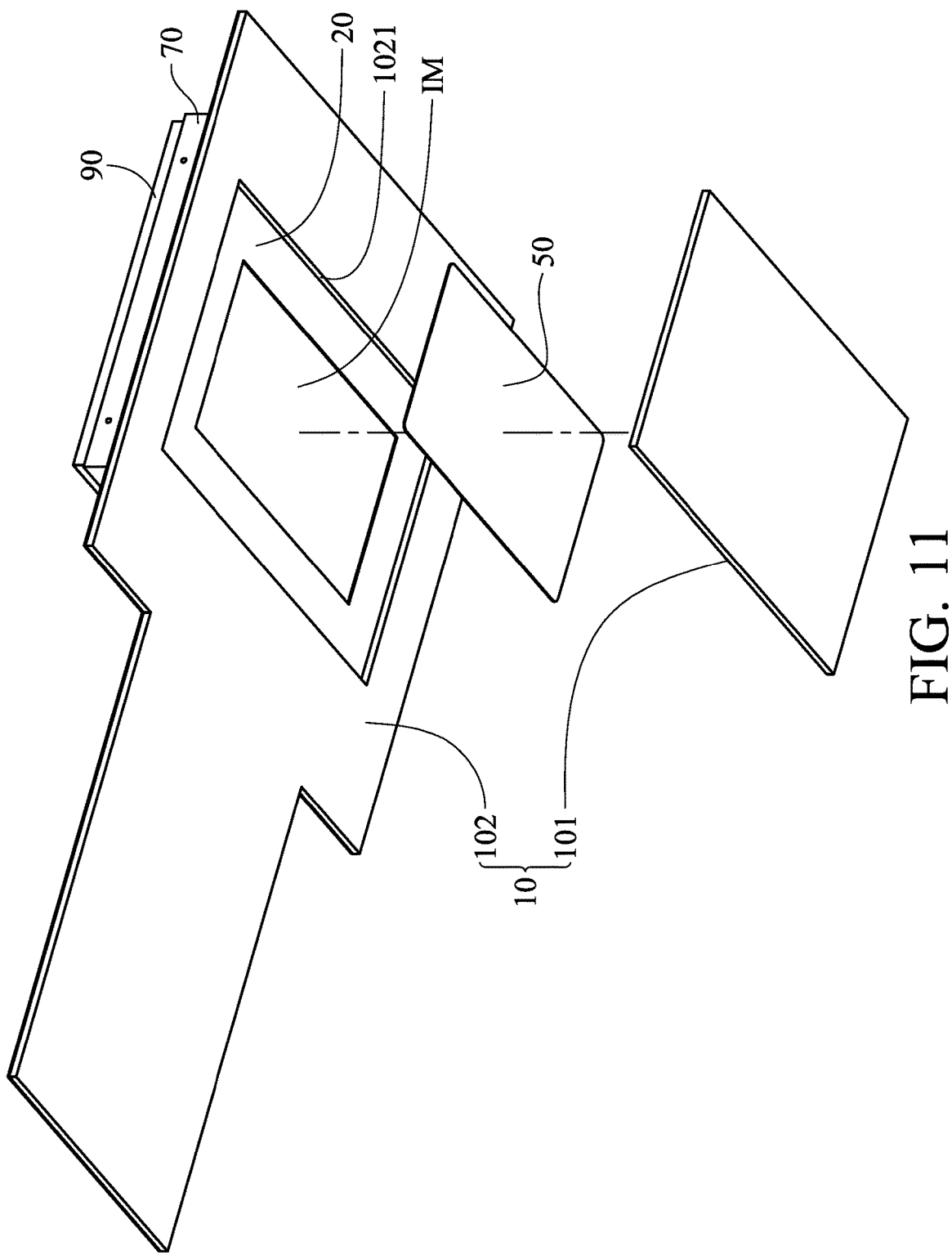
FIG. 11 is a schematic diagram of a photosensitive module according to another embodiment of the present invention.

Refer to FIG. 11, in which a photosensitive module 7 according to another embodiment of the present invention is provided. The substrate 10 in this embodiment can be defined as a main body 101 and a circuit sub-substrate 102. The circuit sub-substrate 102 has a through slot (or a hollow structure) 1021. The main body 101 is disposed in the through slot 1021. The main body 101 can be used to dissipate the heat of the image sensor IM, and the circuit sub-substrate 102 is configured to carry wires or circuit thereon. The portion of the circuit sub-substrate 102 corresponding to the image sensor IM (the portion which overlaps the image sensor IM in the Z-axis direction) is electrically independent. Since the area of the circuit sub-substrate 102 corresponding to the image sensor IM is reduced by the through slot 1021, the inclination of the image sensor IM relative to the substrate 10 can be avoided or greatly reduced by controlling only the flatness of the partial corresponding areas, to simplify the process and improve the reliability of the module. Furthermore, the thickness of the main body 101 disposed in the through slot 1021 may be less than the thickness of the circuit sub-substrate 102. In addition, the main body 101 and the circuit sub-substrate 102 may include different metal materials. For example, the main body 101 includes a metal having high thermal conductivity, such as an aluminum-copper alloy; and the circuit sub-substrate 102 includes a metal that is easy to process, such as copper. In another embodiment, the circuit sub-substrate 102 can be a general plastic circuit board, which is a non-metal circuit board.

Embodiment 8

Figure 12A:
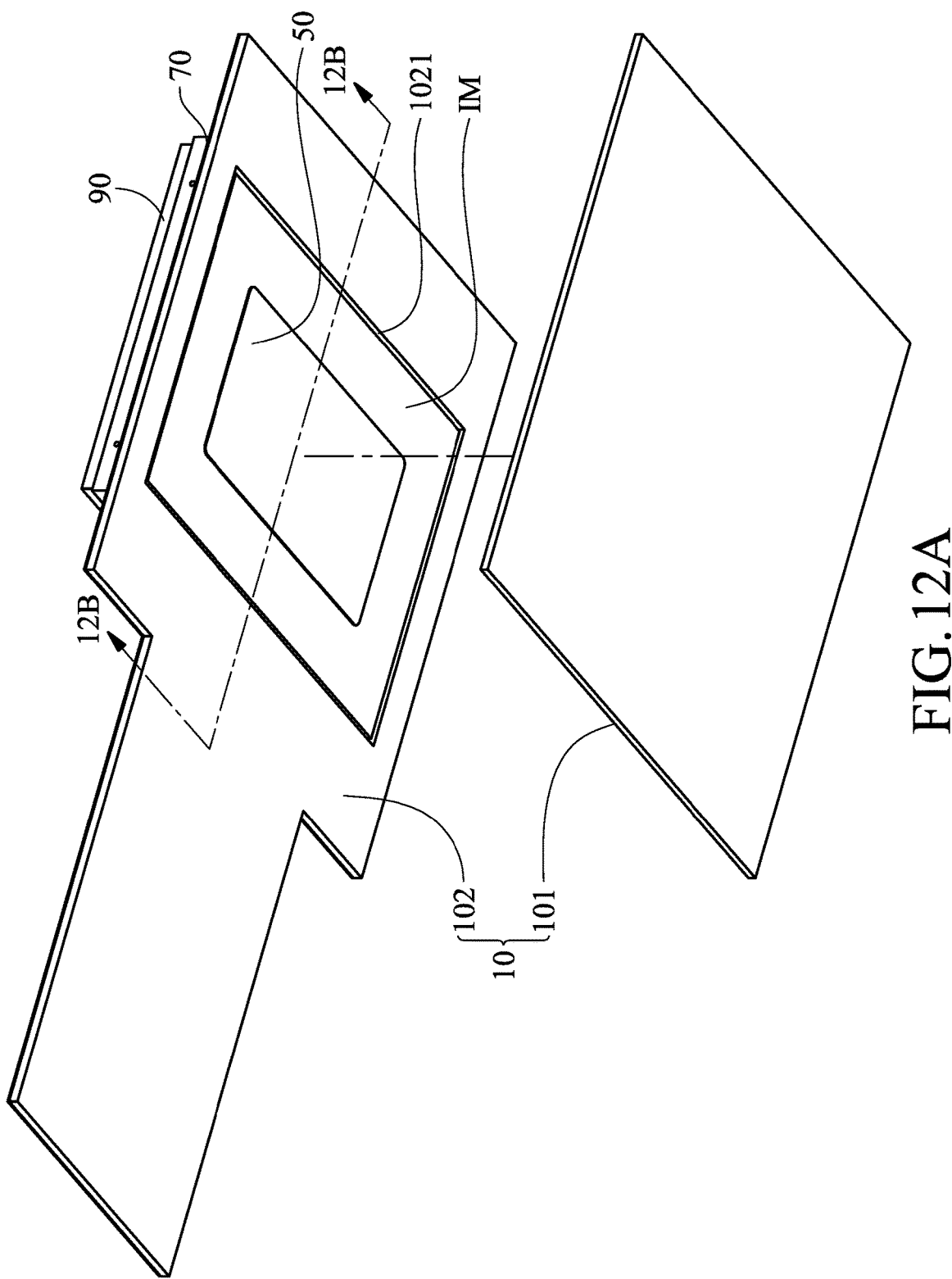
FIG. 12A is a schematic diagram of a photosensitive module according to another embodiment of the present invention.
Figure 12B:
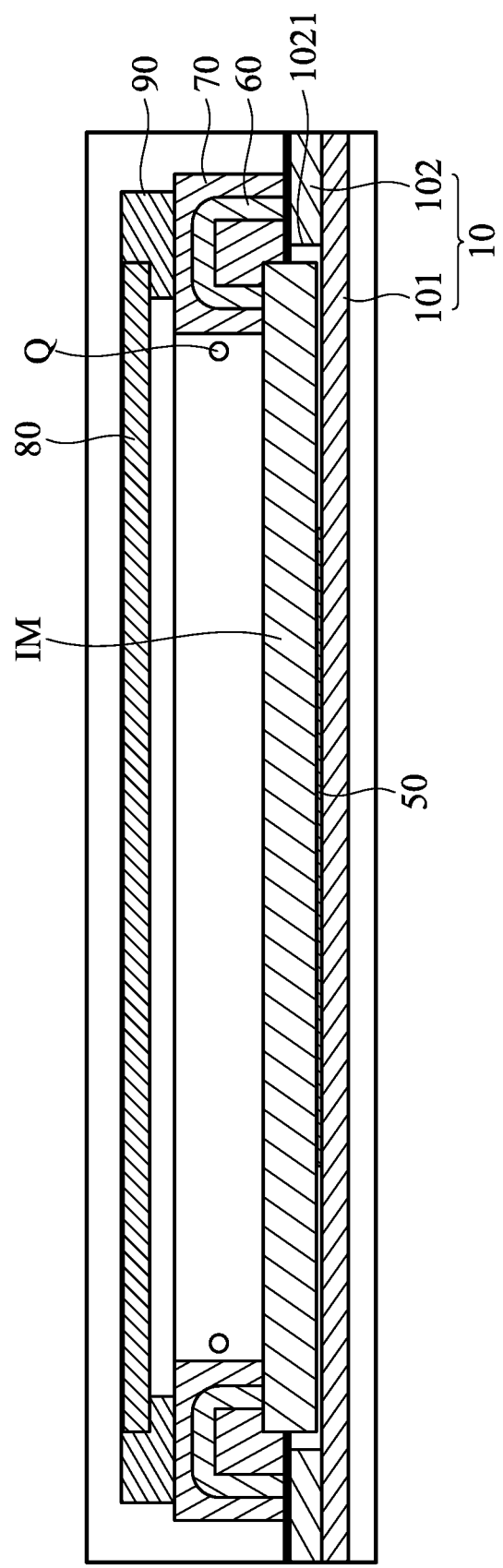
FIG. 12B is a cross-sectional view taken along line 12B-12B of FIG. 12A.

Refer to FIGS. 12A-12B, which provides a photosensitive module 8 according to another embodiment of the present invention. The difference between photosensitive module 8 and photosensitive module 7 in embodiment 7 is that in photosensitive module 8, the image sensor IM is surrounded by the circuit sub-substrate 102: That is, the image sensor IM is received in the through slot 1021 and is connected through the thermal conductive adhesive 50 to the main body 101 which completely covers the through slot 1021 of the circuit sub-substrate 102. In this way, the overall thickness (Z-axis) of the photosensitive module 8 can be reduced by providing the image sensor IM disposed in the through slot 1021. As shown in FIG. 12A, the area of the main body 101 is larger than the main body 101 of the substrate 10 in FIG. 11 (embodiment 7), which helps to improve heat dissipation.

Embodiment 9

Figure 13A:
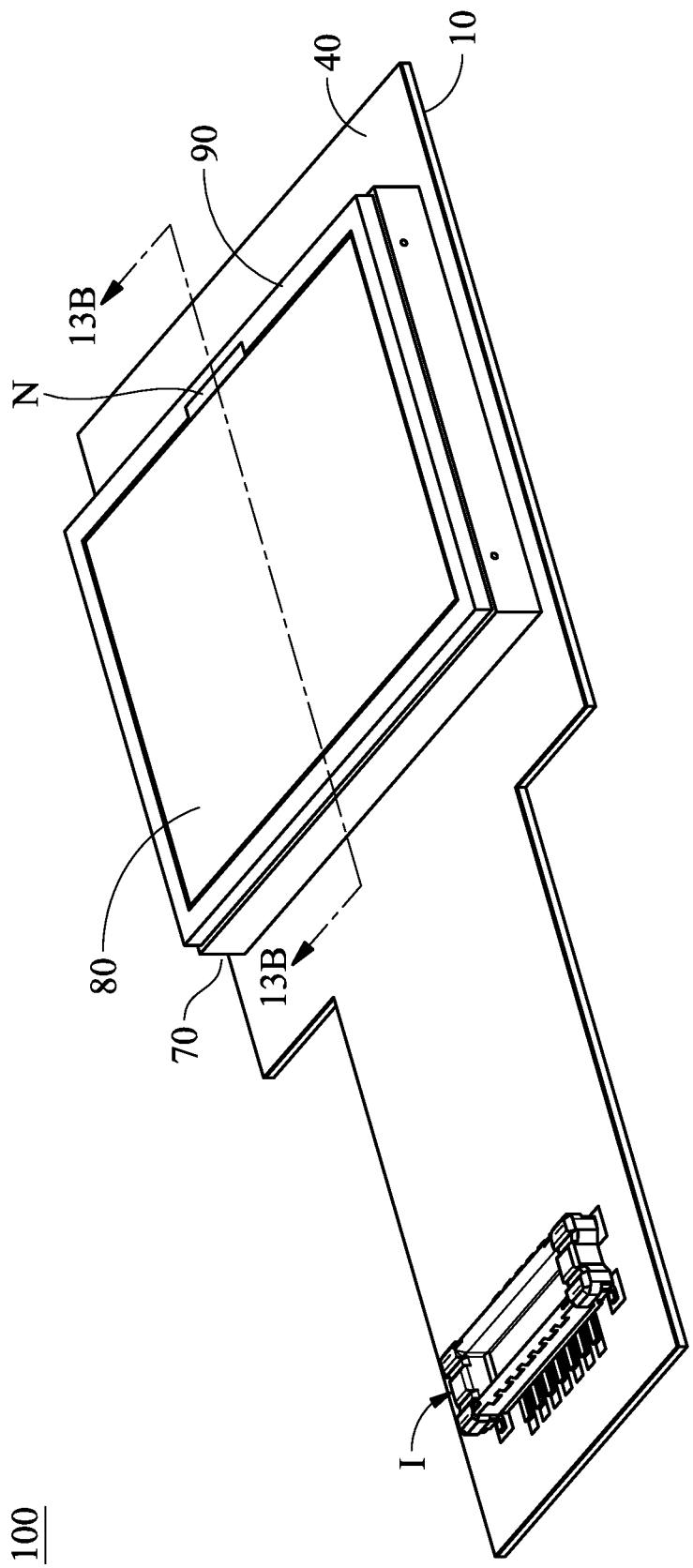
FIG. 13A is a schematic diagram of a photosensitive module according to another embodiment of the present invention.
Figure 13B:
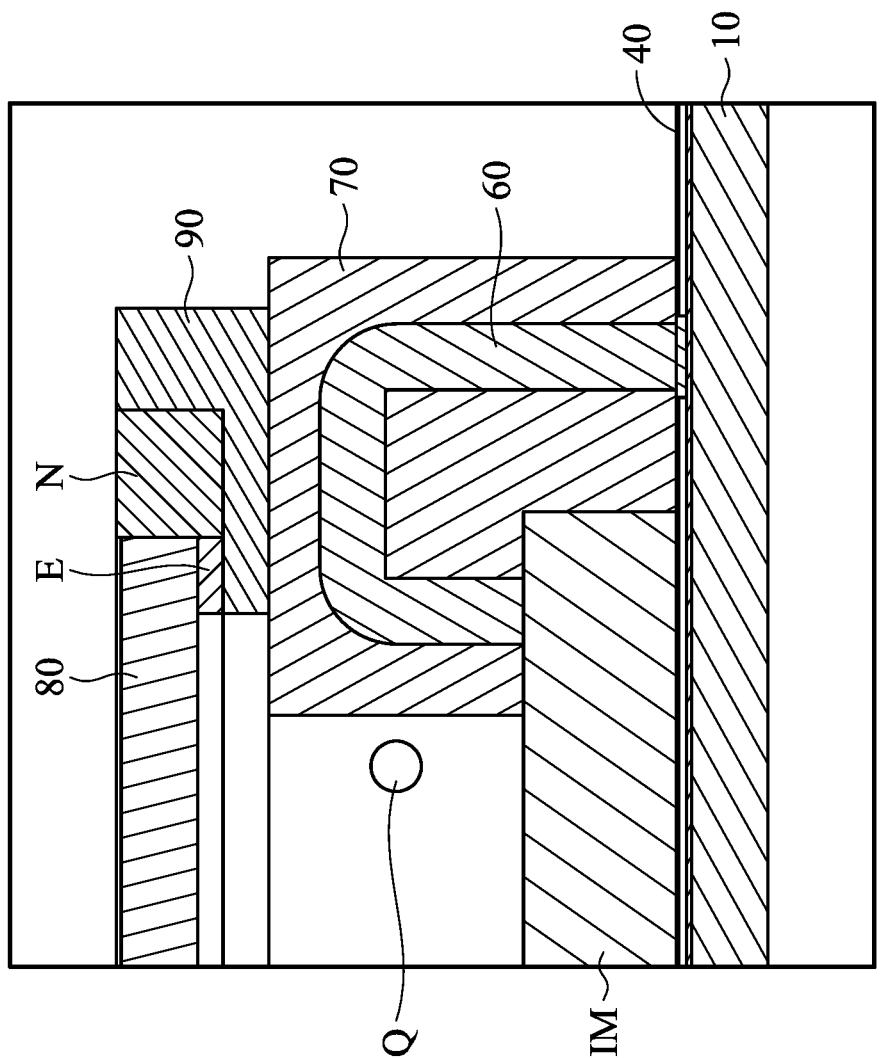
FIG. 13B is a partial cross-sectional view taken along line 13B-13B of FIG. 13A.

Refer to FIGS. 13A-13B, in which a photosensitive module 100 according to another embodiment of the present invention is provided. The photosensitive module 100 further includes a vibration assembly N, which can be an actuator, disposed on the second plastic member 90 for driving or vibrating the transparent plate 80. The vibration assembly N at least partially overlaps the image sensors IM in the light-incident direction O. Foreign matter may become attached to the transparent plate 80 during processing or as a result of an impact with something in the immediate environment. The transparent plate 80 is vibrated by the vibration assembly N (for example, it can be electrically connected to one of the vibration motors disposed in the electronic device) to remove the foreign matter to improve the quality of the image. In addition, an elastic element E is disposed under the transparent plate 80, which connects the transparent plate 80 and the second plastic member 90, and can be used to stabilize and protect the transparent plate 80 when vibrating.

Embodiment 10

Figure 14A:
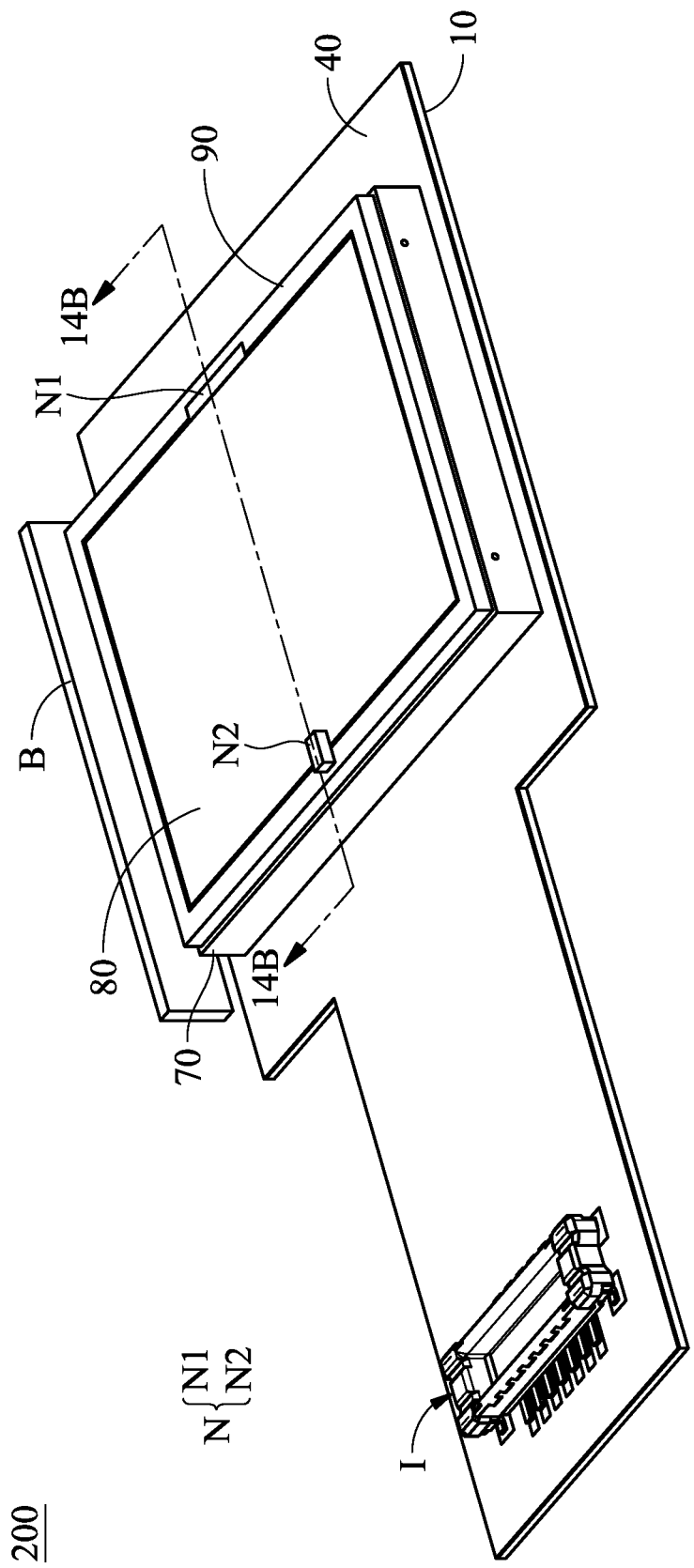
FIG. 14A is a schematic diagram of a photosensitive module according to another embodiment of the present invention.
Figure 14B:
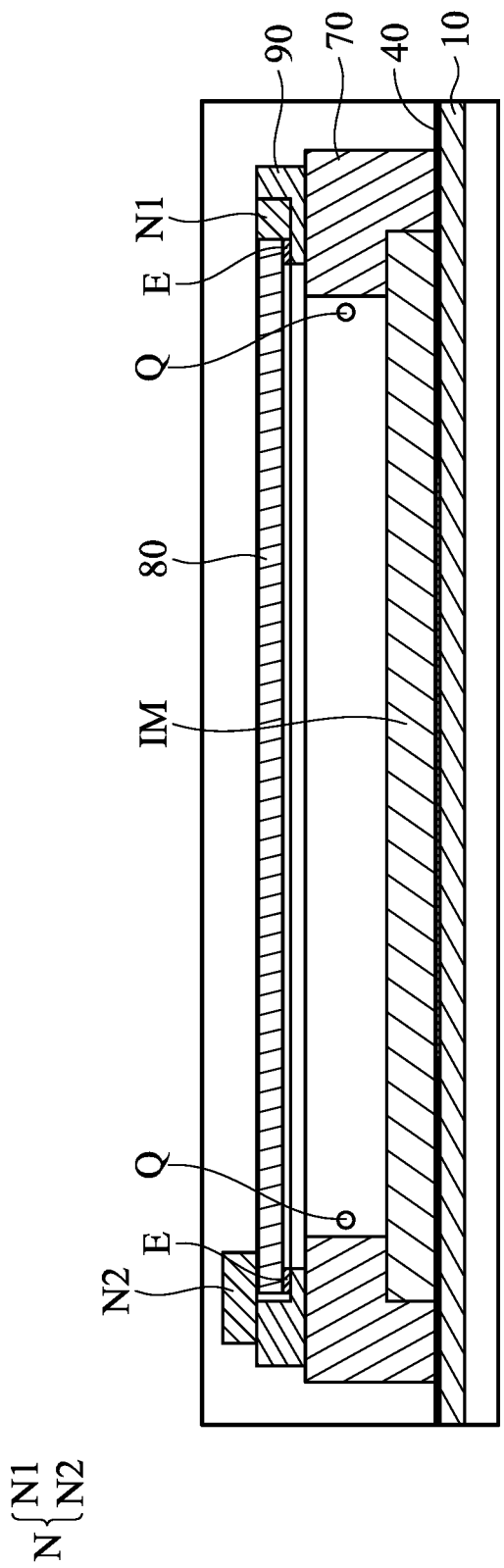
FIG. 14B is a cross-sectional view taken along line 14B-14B of FIG. 14A.

Refer to FIGS. 14A-14B, in which a photosensitive module 200 in accordance with another embodiment of the present invention is provided. The difference between the photosensitive module 10 and the photosensitive module 9 in FIG. 13 is that the vibration assembly N includes a plurality of (two in this embodiment) vibration members N1 and N2, and the two are disposed on the second plastic component 90, and configured to drive the transparent plate 80 to vibrate. When viewed from the light-incident direction O, both vibration members N1 and N2 overlap at least partially with the image sensor IM, wherein the vibration members N1 and N2 drive the transparent plate 80 to move or vibrate in different directions. For example, the vibrating member N1 drives the transparent plate 80 to vibrate in the X-axis direction (a first direction), and the vibrating member N2 drives the transparent plate 80 to vibrate in the Y-axis direction (a second direction), so that the removal of the foreign matter can be greatly improved. Furthermore, a catching member B is disposed on the outer side of the first plastic member 70, adjacent to the substrate 10 and the transparent plate 80, for collecting dust or foreign matter falling from the vibrated transparent plate 80.

Embodiment 11

Figure 15:
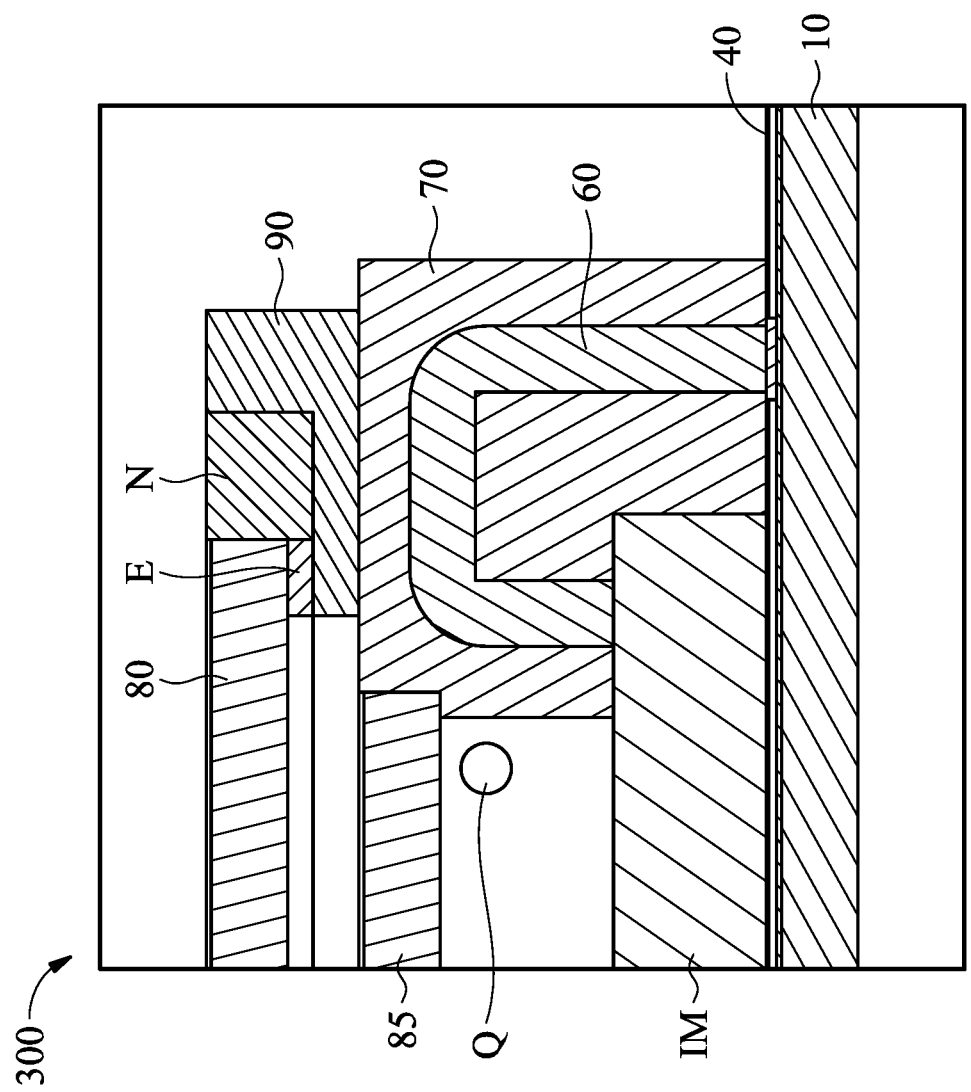
FIG. 15 is a schematic diagram of a photosensitive module according to another embodiment of the present invention.

Refer to FIG. 15, which is a cross-sectional view of a photosensitive module 300 in accordance with another embodiment of the present invention. The difference between the photosensitive module 300 and the photosensitive module 100 of FIG. 13 is that the photosensitive module 300 includes a plurality of transparent plates 80 and 85 arranged along the light direction O, wherein the transparent plate 85 is disposed on the first plastic member 70. The transparent plate 80 is disposed on the second plastic member 90. In the present embodiment, the transparent plate 85 is located between the transparent plate 80 and the image sensor IM, and the transparent plate 80 completely covers or shields the transparent plate 85. The transparent plate 85 is affixed on the first plastic member 70, and the transparent plate 80 can still vibrate by the vibration assembly N. The vibration assembly N drive the one transparent plate 80 which is farther away from the image sensor IM (than the transparent plate 85), so that only the outermost transparent plate 80 needs to be vibrated to remove foreign objects or dust.

In summary, an embodiment of the present invention provides a photosensitive module, including a base assembly, an image sensor, a first plastic member and a transparent plate. The base assembly includes a substrate, and the substrate has a main body including a metal material. The image sensor is disposed on the base assembly and adjacent to the main body of the substrate. The first plastic member is connected to the base assembly and configured to protect the image sensor. The transparent plate is located on the first plastic member. When the photosensitive module receives the light passing through the lens, the light passes through the transparent plate to the image sensor.

The embodiments in present invention have at least one of the advantages or effects: by providing the thermal conductive adhesive to be in contact with the image sensor and the substrate having a metal material, the heat dissipation efficiency of the photosensitive module can be improved. Furthermore, the first and second plastic members stabilize and protect the electrical connection structure and the transparent plate, thereby improving the reliability of the module. In addition, using the substrate having a metal material as a base, because of its good flatness, the degree of skew of the image sensor relative to the substrate can be greatly reduced, it is also advantageous to provide other electronic components on the substrate. This simplifies the overall circuit and the miniaturization can be achieved.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with the true scope of the disclosed embodiments being indicated by the following claims and their equivalents.

What is claimed is:

1. A photosensitive module, configured to receive light passing through a lens, comprising:
    a base assembly, including a substrate, and the substrate has a main body including a metal material;
    an image sensor, disposed on the base assembly and adjacent to the main body of the substrate;
    a first plastic member, connected to the base assembly and configured to protect the image sensor;
    a transparent plate, located on the first plastic member; and
    a thermal conductive adhesive disposed between the substrate and the image sensor;
    wherein when the photosensitive module receives the light passing through the lens, the light passes through the transparent plate to the image sensor;
    wherein the base assembly further includes a first insulating layer, a circuit layer and a second insulating layer, wherein the first insulating layer is disposed between the substrate and the circuit layer, the circuit layer is disposed between the first insulating layer and the second insulating layer, the second insulating layer exposes at least one electrical connection point of the circuit layer, and the electrical connection point is electrically connected to the image sensor;
    wherein the first insulating layer and the second insulating layer each have an opening, and the thermal conductive adhesive is disposed in the openings and is in contact with the image sensor through the openings.

2. The photosensitive module as claimed in claim 1, wherein the first plastic member has at least one through hole, and the first plastic member has a rectangular structure, and the through hole is located in a side wall of the rectangular structure and penetrates the side wall.

3. The photosensitive module of claim 2, wherein the through hole has an outer opening and an inner opening, the outer opening is further from the image sensor than the inner opening, and the outer opening is closer to a reference surface of the substrate than the inner opening.

4. The photosensitive module as claimed in claim 1, further comprising a second plastic member, wherein the transparent plate is located between the first plastic member and the second plastic member, and the transparent plate is sandwiched between the first plastic member and the second plastic member.

5. The photosensitive module as claimed in claim 1, further comprising a lead assembly connecting the image sensor to the base assembly.

6. The photosensitive module as claimed in claim 5, wherein the lead assembly is encapsulated by the first plastic member.

7. The photosensitive module as claimed in claim 5, wherein the first plastic member forms a receiving space with the base assembly, and the image sensor and the lead assembly are located in the receiving space.

8. The photosensitive module as claimed in claim 1, further comprising a soldering assembly connecting the image sensor to the base assembly, and the soldering assembly overlaps the image sensor when viewed from a light-incident direction.

9. The photosensitive module as claimed in claim 1, wherein the substrate further includes a circuit sub-substrate, wherein the circuit sub-substrate has a through slot, and the main body of the substrate is disposed in the through slot.

10. The photosensitive module as claimed in claim 9, wherein both the main body and the circuit sub-substrate have a metal material, and the main body and the circuit sub-substrate have different metal materials.

11. The photosensitive module as claimed in claim 1, wherein the substrate further comprises a circuit sub-substrate, wherein the circuit sub-substrate has a through slot, and the image sensor is disposed in the through slot and is surrounded by the circuit sub-substrate, and the through slot is covered by the main body of the substrate.

12. The photosensitive module as claimed in claim 1, further comprising a vibration assembly disposed on the first plastic member and configured to drive the transparent plate, wherein at least a portion of the vibration assembly overlaps the image sensor when viewed from the light-incident direction.

13. The photosensitive module as claimed in claim 12, wherein the vibration assembly includes at least two vibration members: a first vibration member and a second vibration member, and both are disposed on the first plastic member and configured to drive the transparent plate;
    wherein the first vibrating member drives the transparent plate to move in a first direction, and the second vibrating member drives the transparent plate to move in a second direction, and the first direction is different from the second direction.

14. The photosensitive module as claimed in claim 12, further comprising a catching member disposed on an outer side of the first plastic member and adjacent to the transparent plate, for capturing the dust that falls from the transparent plate because of the vibration produced by the vibration assembly.

15. A photosensitive module, configured to receive light passing through a lens, comprising:
- a base assembly, including a substrate, and the substrate has a main body including a metal material;
- an image sensor, disposed on the base assembly and adjacent to the main body of the substrate;
- a first plastic member, connected to the base assembly and configured to protect the image sensor;
- a transparent plate, located on the first plastic member;
- a lead assembly, connecting the image sensor to the base assembly; and
- a second plastic member, connected to and disposed outside the first plastic member, and the second plastic member carries the transparent plate, wherein the lead assembly is disposed outside the first plastic member and covered by the second plastic member and not in contact with the first plastic member;
- wherein when the photosensitive module receives the light passing through the lens, the light passes through the transparent plate to the image sensor.

16. A photosensitive module, configured to receive light passing through a lens, comprising:
- a base assembly, including a substrate, and the substrate has a main body including a metal material;
- an image sensor, disposed on the base assembly and adjacent to the main body of the substrate;
- a first plastic member, connected to the base assembly and configured to protect the image sensor;
- a transparent plate, located on the first plastic member;
- a lead assembly, connecting the image sensor to the base assembly; and
- a second plastic member, connected to and disposed inside the first plastic member, and the second plastic member sustains the transparent plate, wherein the lead assembly is covered by the second plastic member and is not in contact with the first plastic member;
- wherein when the photosensitive module receives the light passing through the lens, the light passes through the transparent plate to the image sensor.

17. A photosensitive module, configured to receive light passing through a lens, comprising:
- a base assembly, including a substrate, and the substrate has a main body including a metal material;
- an image sensor, disposed on the base assembly and adjacent to the main body of the substrate;
- a first plastic member, connected to the base assembly and configured to protect the image sensor;
- a transparent plate, located on the first plastic member; and
- a second plastic member, disposed on the first plastic member, wherein the transparent plate is located between the first plastic member and the second plastic member, and the transparent plate is disposed on the second plastic member and not in contact with the first plastic member;
- wherein when the photosensitive module receives the light passing through the lens, the light passes through the transparent plate to the image sensor.

18. A photosensitive module, configured to receive light passing through a lens, comprising:
- a base assembly, including a substrate, and the substrate has a main body including a metal material;
- an image sensor, disposed on the base assembly and adjacent to the main body of the substrate;
- a first plastic member, connected to the base assembly and configured to protect the image sensor;
- a transparent plate, located on the first plastic member; and
- a vibration assembly, disposed on the first plastic member and configured to drive the transparent plate, wherein at least a portion of the vibration assembly overlaps the image sensor when viewed from the light-incident direction;
- a plurality of transparent plates, arranged along the light-incident direction, and the vibration assembly drives the transparent plate which is farther from the image sensor.

* * * * *